United States Patent
Tsai et al.

(10) Patent No.: US 9,899,982 B2
(45) Date of Patent: Feb. 20, 2018

(54) ON-CHIP ELECTROMAGNETIC BANDGAP (EBG) STRUCTURE FOR NOISE SUPPRESSION

(71) Applicant: Taiwan Semiconductor Manufacturing Co., Ltd., Hsin-Chu (TW)

(72) Inventors: Ming Hsien Tsai, New Taipei (TW); Chien-Min Lin, Hsinchu (TW); Fu-Lung Hsueh, Kaohsiung (TW); Han-Ping Pu, Taichung (TW); Sa-Lly Liu, Hsin Chu (TW); Sen-Kuei Hsu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/948,477

(22) Filed: Nov. 23, 2015

(65) Prior Publication Data
US 2017/0149404 A1 May 25, 2017

(51) Int. Cl.
| | |
|---|---|
| *H01L 29/93* | (2006.01) |
| *H01L 23/528* | (2006.01) |
| *H01L 23/522* | (2006.01) |
| *H03H 1/00* | (2006.01) |
| *H03H 7/01* | (2006.01) |

(52) U.S. Cl.
CPC ....... *H03H 1/0007* (2013.01); *H01L 23/5223* (2013.01); *H01L 23/5227* (2013.01);
(Continued)

(58) Field of Classification Search
CPC ..... H01L 23/5227; H01L 28/10; H01L 27/08; H01L 2924/3011; H01L 23/5286;
(Continued)

(56) References Cited

U.S. PATENT DOCUMENTS 6,255,704 B1 * 7/2001 Iwata ............... H01L 21/82385
257/368
6,541,840 B1 * 4/2003 Terayama ............... H01L 29/92
257/516

(Continued)

FOREIGN PATENT DOCUMENTS

JP 2009246014 A 10/2009

OTHER PUBLICATIONS

Hwang, et al. "An On-Chip Electromagnetic Bandgap Structure using an On-Chip Inductor and a MOS Capacitor." IEEE Microwave and Wireless Components Letters, vol. 21, No. 8, Aug. 2011.

(Continued)

*Primary Examiner* — Marcos D Pizarro
*Assistant Examiner* — Long H Le
(74) *Attorney, Agent, or Firm* — Eschweiler & Potashnik, LLC

(57) ABSTRACT

An integrated circuit (IC) die for electromagnetic band gap (EBG) noise suppression is provided. A power mesh and a ground mesh are stacked within a back end of line (BEOL) region overlying a semiconductor substrate, and an inductor is arranged over the power and ground meshes. The inductor comprises a plurality of inductor segments stacked upon one another and connected end to end to define a length of the inductor. A capacitor underlies the power and ground meshes, and is connected in series with the inductor. Respective terminals of the capacitor and the inductor are respectively coupled to the power and ground meshes. A method for manufacturing the IC die is also provided.

20 Claims, 16 Drawing Sheets

(52) U.S. Cl.
CPC .......... *H01L 23/5286* (2013.01); *H01L 29/93* (2013.01); *H03H 7/0115* (2013.01)

(58) Field of Classification Search
CPC . H01L 23/5223; H01L 29/93; H01F 17/0006; H03H 7/0115
See application file for complete search history.

(56) References Cited

U.S. PATENT DOCUMENTS

| | | | | |
|---|---|---|---|---|
| 6,557,154 | B1* | 4/2003 | Harada | G06F 17/5036 |
| | | | | 174/260 |
| 6,573,588 | B1* | 6/2003 | Kumamoto | H01L 29/92 |
| | | | | 257/371 |
| 7,288,826 | B2* | 10/2007 | Furumiya | H01L 21/761 |
| | | | | 257/516 |
| 2006/0046353 | A1* | 3/2006 | Shrowty | G11C 5/063 |
| | | | | 438/129 |
| 2009/0268419 | A1* | 10/2009 | Choi | H01L 24/24 |
| | | | | 361/767 |
| 2009/0322447 | A1* | 12/2009 | Daley | H01L 23/5223 |
| | | | | 333/185 |
| 2010/0025853 | A1* | 2/2010 | Lindgren | G06F 17/5068 |
| | | | | 257/763 |
| 2015/0084733 | A1* | 3/2015 | Sun | H01F 27/362 |
| | | | | 336/84 C |
| 2016/0149551 | A1* | 5/2016 | Taniguchi | H03H 7/0115 |
| | | | | 333/185 |

OTHER PUBLICATIONS

Ang, et al. "An On-chip Voltage Regulator using Switched Decoupling Capacitors." IEEE International Solid-State Circuits Conference, published in 2000.

Gu, et al. "Distributed Active Decoupling Capacitors for On-Chip Supply Noise Cancellation in Digital VLSI Circuits." Symposium on VLSI Circuits Digest of Technical Papers, published in 2006.

Carrier, Patrick. "What's the Difference Between Signal Integrity and Power Integrity?" Retrieved from http://electronicdesign.com/boards/what-s-difference-between-signal-integrity-and-power-integrity Published May 2, 2012.

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 1 (Cover page to p. 60).

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 2 (pp. 61-138).

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 3 (pp. 139-153).

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 4 (pp. 154-168).

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 5 (pp. 169-183).

Kim, Tae Hong. "Electromagnetic Band Gap (EBG) Synthesis and Its Application in Analog-To-Digital Converter Load Boards." Dissertation Presented to the Georgia Institute of Technology, Apr. 2008. Part 6 (pp. 184-216).

\* cited by examiner

ON-CHIP ELECTROMAGNETIC BANDGAP (EBG) STRUCTURE FOR NOISE SUPPRESSION

BACKGROUND

Over the past decades, the semiconductor industry has continually improved the processing capabilities and power consumption of integrated circuits (ICs) by shrinking the minimum feature size. This has enabled the development and continual improvement of high speed systems-on-chips (SoCs) and systems-in-packages (SiPs) with low operating voltages and high clock rates. Such SoCs and SiPs are increasingly important with the advent of the internet of things (IoT) and advanced communication systems, such as fourth and fifth generation wireless communication systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
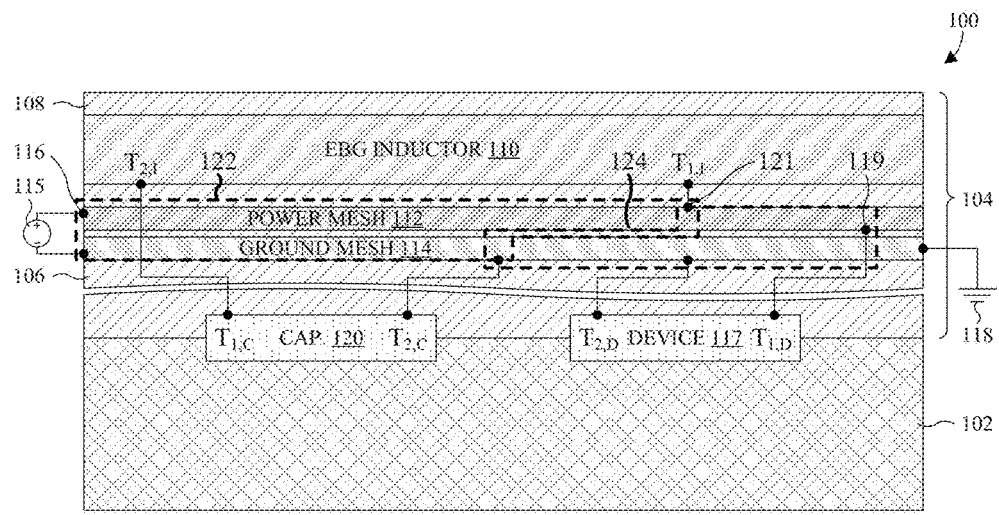
FIG. 1 illustrates a cross-sectional view of some embodiments of an electromagnetic bandgap (EBG) structure for noise suppression.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Power distribution networks use power and ground planes to distribute power and ground voltages from pins of integrated circuit (IC) chips to multiple devices in the IC chips. As clock rates continue to increase and operating voltages continue to decrease in high speed systems-on-chips (SoCs) and systems-in-packages (SiPs), signal integrity (SI) and power integrity (PI) are becoming increasingly important to overall data transfer rates. However, electromagnetic interference (EMI), power fluctuations, and ground bounce noise (GBN) (a.k.a., simultaneous switching noise (SSN)) on the power and ground planes increasingly degrade SI and PI. Degradation of PI can cause large switching currents to flow in the power and ground planes, which can degrade the performance and reliability of devices within an IC chip.

Many solutions to prevent noise on power distribution networks rely upon printed circuit board (PCB)-based solutions that are not integrated with SoCs and SiPs. However, such solutions increase costs and utilize more area. Other solutions to the foregoing challenges that are integrated with SoCs and SiPs often employ on-chip decoupling capacitors between power and ground planes. The decoupling capacitors create low impedance paths between the power and ground planes, which improve SI and PI. However, the decoupling capacitors are not effective at high frequencies, such as frequencies of greater than about 1 or 2 gigahertz (GHz), due to finite lead inductance.

The present application is directed towards an electromagnetic bandgap (EBG) structure for use within SoCs and SiPs. In some embodiments, the EBG structure comprises a power mesh and a ground mesh stacked within a back end of line (BEOL) region of the EBG structure, and further comprises an inductor integrated into the BEOL region over the power and ground meshes. The power and ground meshes share a common footprint and may have edges or centroids aligned to one another. The inductor has a ring-shaped footprint (e.g., a square or rectangle ring-shaped footprint), and comprises a plurality of inductor segments stacked upon one another and connected end to end by inter-metal vias. Further, the EBG structure comprises a capacitor integrated into the BEOL region or a front end of line (FEOL) region of the EBG structure that underlies the BEOL region.

The EBG structure advantageously provides a low inductance noise path through the series connection of the inductor and the connector to filter noise from the power and ground meshes. This results in good SI and PI when the EBG structure has a low operating voltage and/or a high clock rate. Further, the EBG structure advantageously allows a center frequency of the filter to be readily adjusted without increasing area. Even more, the EBG structure can advantageously be combined with additional EBG structures for improved noise suppression.

With reference to FIG. 1, a cross-sectional view 100 of some embodiments of an EBG structure is provided. The EBG structure comprises a periodic structure configured to suppress the propagation of unwanted noise (e.g., electromagnetic waves) in a specified frequency band into power and ground planes of the EBG structure. As illustrated, the EBG structure comprises a semiconductor substrate 102 and a BEOL region 104 arranged over the semiconductor substrate 102. The BEOL region 104 comprises a plurality of interlayer dielectric (ILD) layers 106, 108 stacked upon one another. Further, the BEOL region 104 comprises a power distribution network and an inductor 110 arranged between the ILD layers 106, 108.

The power distribution network comprises a power mesh 112 and a ground mesh 114 stacked between the ILD layers 106, 108, and respectively connected to terminals of a power source 115 at input nodes 116 (only one of which is labeled). The power mesh 112 may comprise, for example, one or more metal layers and is configured to provide a supply voltage to a semiconductor device 117, such a transistor, within the semiconductor substrate 102. The ground mesh 114 may comprise, for example, one or more metal layers and is connected to ground 118. Further, the ground mesh 114 is configured to provide a ground to the semiconductor device 117. Terminals $T_{1,D}$, $T_{2,D}$ of the semiconductor device 117 may be connected to the power and ground meshes 112, 114 at output nodes 119 (only one of which is labeled). In some embodiments, the ground mesh 114 is spaced from the power mesh 112 by a dielectric material that covers the ground mesh 114 and extends between a bottom surface of the power mesh 112 and a top surface of the ground mesh 114.

The inductor 110 is arranged over the power distribution network, and connected in series with a set of one or more capacitors 120 between inter-line nodes 121 (only one of which is labeled). A first terminal $T_{1,I}$ of the inductor 110 is connected to the power mesh 112, and a second terminal $T_{2,I}$ of the inductor 110 is connected to the capacitor(s) 120. In some embodiments, the inductor 110 may comprise one or more metal layers arranged between the ILD layers 106, 108. The capacitor(s) 120 underlie the power distribution network, and are arranged in the BEOL region 104, the semiconductor substrate 102, or distributed amongst the BEOL region 104 and the semiconductor substrate 102. The capacitor(s) 120 comprise one or more corresponding first terminals $T_{1,C}$ electrically connected to the second terminal $T_{2,I}$ of the inductor 110, and further comprise one or more corresponding second terminals $T_{2,C}$ connected to the ground mesh 114.

Between the input and output nodes 116, 119, regions of the power and ground meshes 112, 114 define transmission lines (or regions) 122, 124. A first transmission line 122 is arranged between the input nodes 116 and the inter-line nodes 121, and a second transmission line 124 is arranged between the inter-line nodes 121 and the output nodes 119. In some embodiments, the transmission lines 122, 124 may be modeled as, for example, resistance-capacitance-inductance (RLC) circuits of parasitic elements.

The EBG structure advantageously filters or otherwise suppresses a frequency band of noise on the power and ground meshes 112, 114, resulting in good SI and PI. For example, the EBG structure may suppress noise generated by high-speed signals passing through an interconnect network (e.g., arranged within the BEOL region 104), and/or noise generated by switching of devices within the semiconductor substrate 102, from affecting the power and ground meshes 112, 114. Further, the inductor 110 and the capacitor(s) 120 allow the frequency band to be centered at high frequencies, such as frequencies over 1 or 2 GHz, which is advantageous for SoCs and SiPs with high clock rates and low operating voltages. Even more, properties (e.g., size, inductance, capacitance, etc.) of the inductor 110 and the capacitor(s) 120 may advantageously be varied to readily change a center of the frequency band without substantially increasing area.

Figure 2:
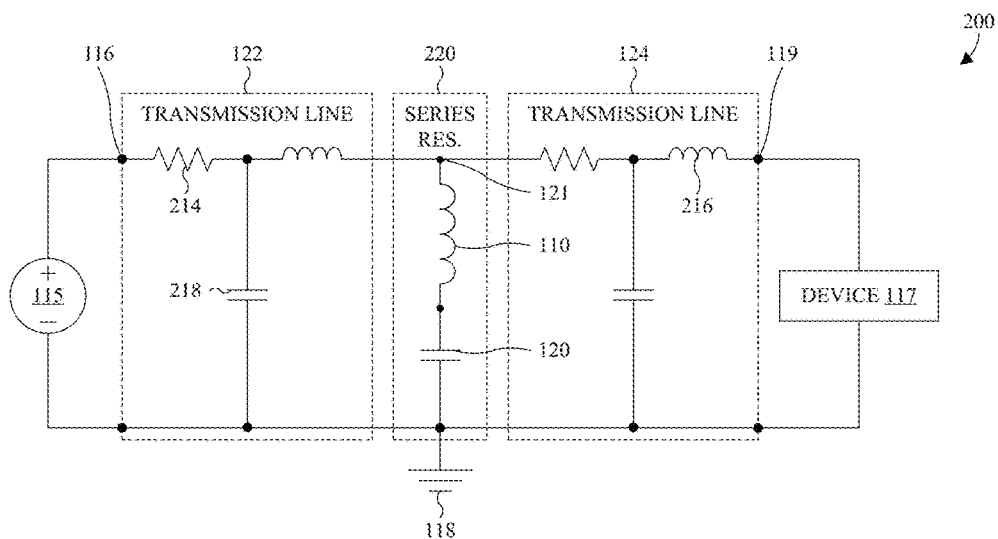
FIG. 2 illustrates a circuit diagram modeling some embodiments of the EBG structure of FIG. 1.

With reference to FIG. 2, a circuit diagram 200 modeling some embodiments of the EBG structure of FIG. 1 is provided. As illustrated, a power source 115 is connected to a semiconductor device 117 through a pair of transmission lines 122, 124 that are connected output to input. The power source 115 is connected to a first transmission line 122 of the transmission line pair at input nodes 116, and the semiconductor device 117 is connected to a second transmission line 124 of the transmission line pair at output nodes 119. The input and output nodes 116, 119 correspond to locations on the power and ground meshes 112, 114 of FIG. 1 where the power source 115 and the semiconductor device 117 connect to the power and ground meshes 112, 114.

The transmission lines 122, 124 are connected to one another at inter-line nodes 121 that are intermediate the transmission lines 122, 124. The inter-line nodes 121 correspond to locations on the power and ground meshes 112, 114 of FIG. 1 that are intermediate the locations of the input and output nodes 116, 119. Further, the transmission lines 122, 124 correspond to regions of the power and ground meshes 112, 114 of FIG. 1 that are intermediate the locations of the nodes 116, 119, 121. For example, the first transmission line 122 may correspond to regions of the power and ground meshes 112, 114 of FIG. 1 that are intermediate the locations of the input nodes 116 and the inter-line nodes 121. In some embodiments, the transmission lines 122, 124 are modeled as parasitic elements (not shown in FIG. 1) that are arranged in resistor-inductor-capacitor (RLC) circuits. For example, the transmission lines 122, 124 may comprise corresponding resistors 214 and inductors 216 connected end to end between the input and output nodes 116, 119, as well as corresponding capacitors 218 connected between ground 118 and internal nodes of respective resistor-inductor pairs.

A series resonator 220 is connected to the inter-line nodes 121, and comprises an inductor 110 connected in series with a set of one or more capacitors 120. In some embodiments, the inductor 110 has an inductance of about 0.1 nanohenry, and/or the capacitor(s) 120 have a collective capacitance of about 0.3 picofarad. The series resonator 220 advantageously provides a noise path for noise on the transmission lines 122, 124, thereby removing noise from the transmission lines 122, 124. In some embodiments, the impedance $Z_w$ of the series resonator 220 at an angular frequency w is calculated as $$Z_w = \frac{1 - w^2 LC}{jwC},$$

where L is an inductance of the inductor 110 and C is a combined capacitance of the capacitor(s) 120. Further, in some embodiments, the smallest impedance $Z_s$ of the series resonator 220 is calculated using the foregoing equation at a resonant angular frequency $w_{res}$ of the series resonator 220. The resonant angular frequency $w_{res}$ of the series resonator 220 may be calculated as, for example, $$w_{res} = \frac{1}{\sqrt{LC}}.$$

Although not shown, in other embodiments, multiple series resonators may be employed to improve noise suppression and/or isolation. In such embodiments, N+1 transmission lines are sequentially connected from output to input between the input and output nodes 208, 210, where N is the number of series resonators. Further, the series resonators are connected to individual inter-line nodes between individual pairs of transmission lines. As above, the transmission lines correspond to regions of the power and ground meshes 112, 114 of FIG. 1, and may be modeled as RLC circuits.

Figure 3:
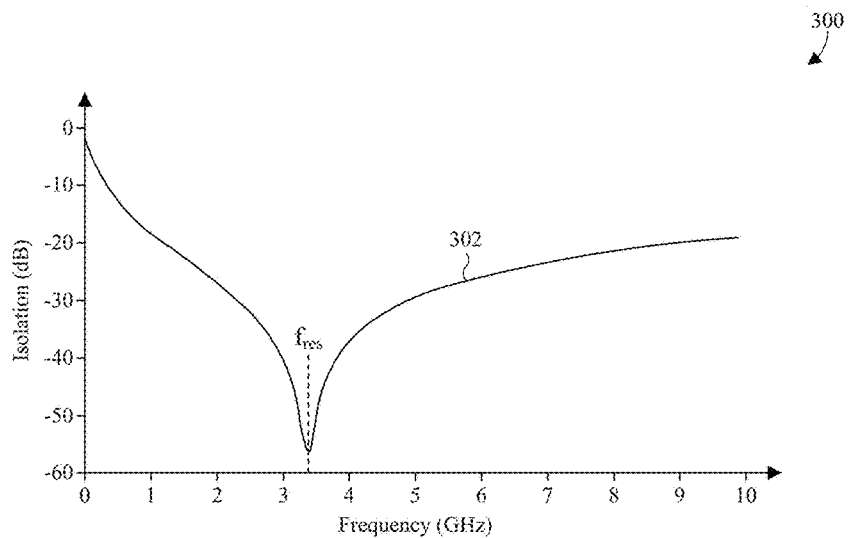
FIG. 3 illustrates a graph of some embodiments of an isolation response curve for the EBG structure of FIG. 1.

With reference FIG. 3, a graph 300 illustrates some embodiments of an isolation response curve 302 for the EBG structure of FIG. 1. The isolation response curve 302 describes noise isolation (i.e., attenuation or suppression) in terms of decibels, and as a function of frequency in terms of GHz. As seen, the EBG structure has a resonant frequency $f_{res}$ (i.e., a frequency of peak isolation) around 3.3 GHz. By adjusting the inductance of the inductor and/or the capacitance of the capacitor, the resonant frequency $f_{res}$ can be shifted as desired. Further, by increasing the number of EBG structures, isolation can be enhanced.

Figure 4:
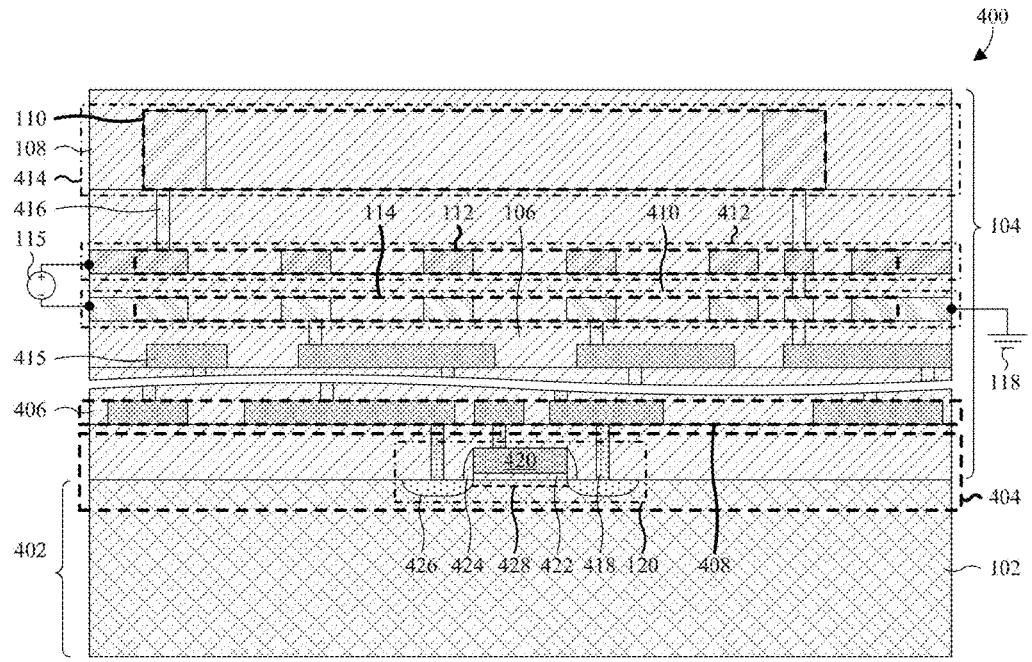
FIG. 4 illustrates a cross-sectional view of some more detailed embodiments of the EBG structure of FIG. 1.

With reference to FIG. 4, a cross-sectional view 400 of some more detailed embodiments of the EBG structure of FIG. 1 is provided. As illustrated, a FEOL region 402 comprises a semiconductor substrate 102 and a device region 404 arranged on an upper side of the semiconductor substrate 102. The semiconductor substrate 102 may be, for example, a bulk semiconductor substrate, such as a bulk silicon substrate, or a silicon-on-insulator (SOI) substrate. The device region 404 comprises electronic devices, such as, for example, transistors, capacitors, diodes, memory cells, and so on.

A BEOL region 104 is arranged over the FEOL region 402. The BEOL region 104 comprises a plurality of ILD layers 106, 108, 406 and a plurality metal layers 408, 410, 412, 414. The ILD layers 106, 108, 406 are stacked upon one another, and may be, for example, a low κ dielectric material (i.e., a dielectric material with a dielectric constant κ less than about 3.9) or an oxide, such as silicon dioxide. The metal layers 408, 410, 412, 414 comprise metal features, such as metal lines 415 and contact pads, and are stacked upon one another between the ILD layers 106, 108, 406. Further, the metal layers 408, 410, 412, 414 are interconnected by inter-metal vias 416, and connected to the device region 404 by contact vias 418. For simplicity, only one inter-metal via 416 and only one contact via 418 are labeled. The metal layers 408, 410, 412, 414 and the inter-metal and/or contact vias 416, 418 may be, for example, copper, aluminum copper, aluminum, or some other material.

An inductor 110 is arranged in the metal layers 408, 410, 412, 414. In some embodiments, the inductor 110 is arranged in one or more topmost layers of the metal layers 408, 410, 412, 414. Further, in some embodiments, the inductor 110 is arranged in multiple layers of the metal layers 408, 410, 412, 414. For example, the inductor 110 may correspond to overlapping regions of 2 or 3 topmost metal layers. The multiple layers may be configured to increase a thickness of the inductor 110, which increases the quality factor and/or the resistance of the inductor 110. Alternatively, the multiple layers may be configured to increase a length of the inductor 110, which increases the inductance of the inductor 110.

A power mesh 112 and a ground mesh 114 are stacked in the BEOL region 104, under the inductor 110. Further, in some embodiments, the power mesh 112 overlies the ground mesh 114. In other embodiments, the ground mesh 114 overlies the power mesh 112. The power and ground meshes 112, 114 are arranged in two of the metal layers 408, 410, 412, 414. For example, the power and ground meshes 112, 114 correspond to overlapping regions of the two metal layers. In some embodiments, the power and ground meshes 112, 114 are adjacent to one another with no intervening metal layer. In other embodiments, the power and ground meshes 112, 114 are spaced by one or more intervening metal layers. The power and ground meshes 112, 114 are connected to respective terminals of a power source 115, such as a direct current (DC) or alternating current (AC) power source. Further, the ground mesh 114 is connected to ground 118, and the power mesh 112 is connected to a first terminal of the inductor 110. In some embodiments, the power mesh 112 is electrically coupled to the first terminal of the inductor 110 through the inter-metal vias 416 and/or the other metal layers (not shown).

One or more capacitors 120 underlie the power and ground meshes 112, 114, and are connected between the inductor 110 and the ground mesh 114. In some embodiments, the capacitor(s) 120 are connected between the inductor 110 and the ground mesh 114 through the inter-metal and/or contact vias 416, 418 and/or the metal layers 408, 410, 412, 414. The capacitor(s) 120 comprise one or more BEOL capacitors and/or one or more FEOL capacitors. The BEOL capacitor(s) are arranged in the BEOL region 104 and comprise, for example, a metal-oxide-metal (MOM) capacitor and/or a metal-insulator-metal (MIM) capacitor. The FEOL capacitor(s) are arranged in the FEOL region 402 and comprise, for example, a metal-oxide-semiconductor (MOS) capacitor, a MOS varactor, or a diode-based capacitor.

In some embodiments, the capacitor(s) 120 comprise a gate structure 420 overlying a gate dielectric structure 422, a spacer structure 424 lining sidewalls of the gate structure 420, and source/drain regions 426 laterally spaced on opposite sides of a channel region 428 underlying the gate structure 420. The source/drain regions 426 may be, for example, doped regions of the semiconductor substrate 102 and/or may be, for example, electrically connected to the ground mesh 114. The gate dielectric structure 422 may be, for example, silicon dioxide or some other dielectric, and the spacer structure 424 may be, for example, silicon nitride or some other dielectric. The gate structure 420 may be, for example, electrically connected to the inductor 110 and/or may be, for example, doped polysilicon or a metal.

Figure 5:
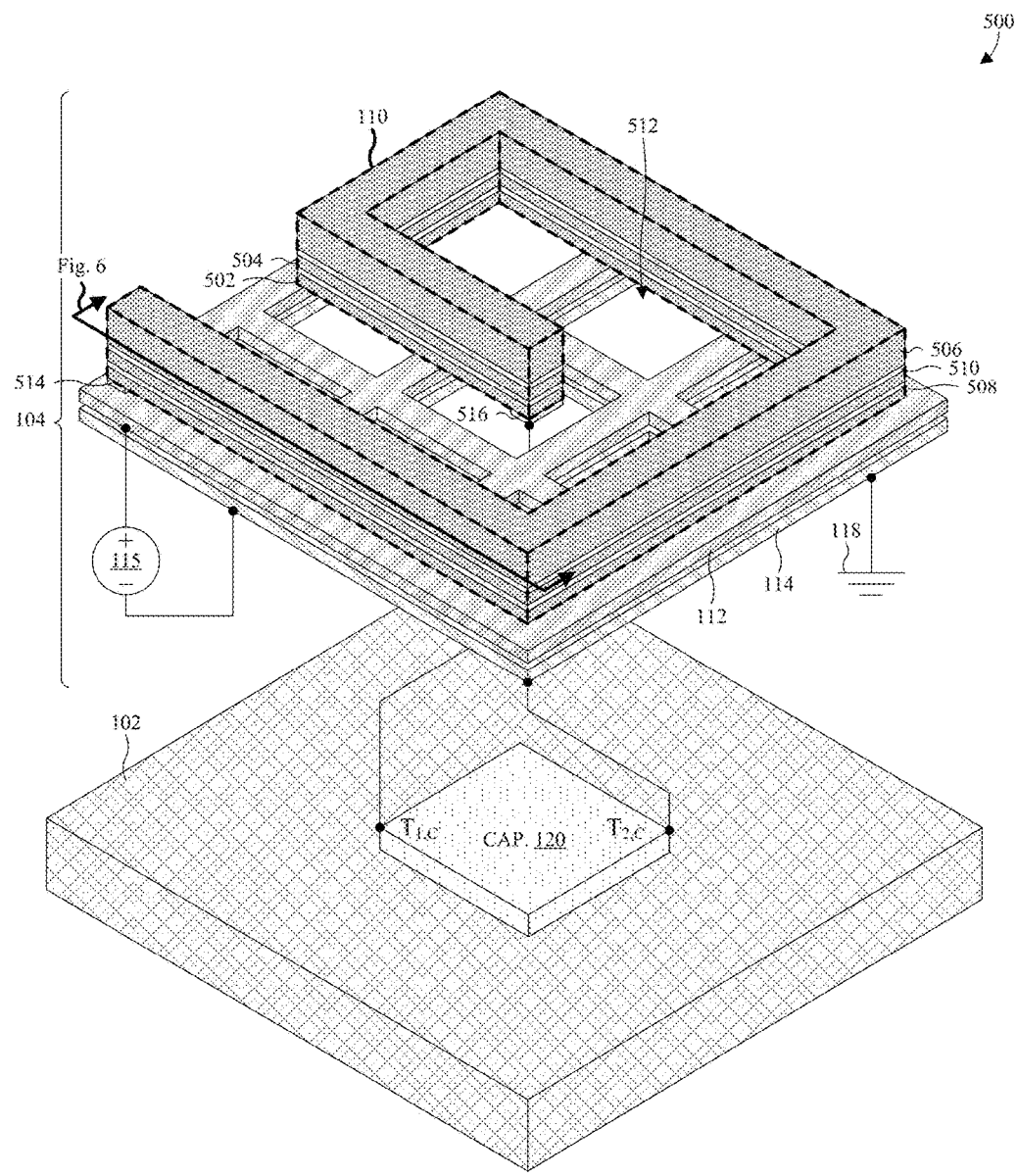
FIG. 5 illustrates a perspective view of some more detailed embodiments of the EBG structure of FIG. 1.

With reference to FIG. 5, a perspective view 500 of some other more detailed embodiments the EBG structure of FIG.

1 is provided. As illustrated, an inductor 110 is arranged over power and ground meshes 112, 114 and, in some embodiments, is shaped like the letter "G". The inductor 110 is defined by a plurality of inductor metal layers 502, 504, 506 of a BEOL region 104. Advantageously, using multiple inductor metal layers 502, 504, 506 to define the inductor 110 increases the thickness of the inductor 110, which increases the quality factor and/or the resistance of the inductor 110. In some embodiments, the inductor metal layers 502, 504, 506 are topmost metal layers of the BEOL region 104. Further, in some embodiments, the inductor metal layers 502, 504, 506 share a common footprint, and/or are spaced and interconnected by one or more inductor inter-metal vias 508, 510 arranged therebetween. The inductor inter-metal via(s) 508, 510 may, for example, share the common footprint. In other embodiments, the footprints of the inductor metal layers 502, 504, 506 are different. Further, in other embodiments, the footprints of the inductor inter-metal via(s) 508, 510 are different.

The power and ground meshes 112, 114 are stacked upon one another, below the inductor 110. In some embodiments, the power and ground meshes 112, 114 share a common footprint. In other embodiments, the footprints of the power and ground meshes 112, 114 are different. Further, in some embodiments, the power mesh 112 is arranged over the ground mesh 114. In other embodiments, the ground mesh 114 is arranged over the power mesh 112. The power and ground meshes 112, 114 comprise a mesh of openings 512 arranged in rows and columns. In some embodiments, openings of the power mesh 112 share a common footprint with openings of the ground mesh 114 and/or are aligned to corresponding openings of the ground mesh 114 (e.g., by centroids, width-wise centers, or edges). A power source 115 is electrically connected between the power and ground meshes 112, 114. Further, the power mesh 112 is electrically connected to a first end of the inductor 110 by an inductor-power inter-metal via 514, and the ground mesh 114 is electrically connected to ground 118.

One or more capacitors 120 underlie the power and ground meshes 112, 114. In some embodiments, the capacitor(s) 120 are arranged in a semiconductor substrate 102, in the BEOL region 104, or distributed between the semiconductor substrate 102 and the BEOL region 104. The capacitor(s) 120 are collectively connected between the ground mesh 114 and a second end of the inductor 110 that is opposite the first end. For example, the capacitor(s) 120 may be connected to the second end of the inductor 110 through one or more capacitor-inductor inter-metal vias 516 and/or one or more metal layers.

Figure 6:
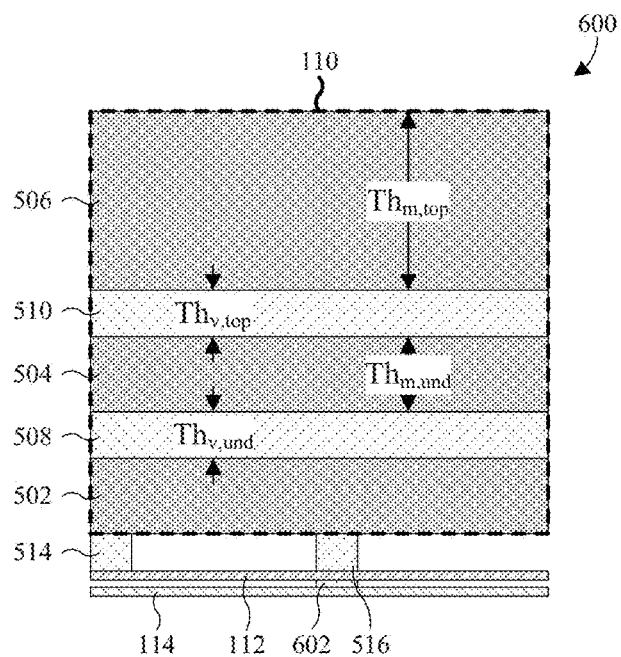
FIG. 6 illustrates a cross-sectional view of the EBG structure of FIG. 5.

With reference to FIG. 6, a cross-sectional view 600 of some embodiments of the inductor 110 of FIG. 5 is provided. As illustrated, an inductor 110 comprises a plurality of inductor metal layers 502, 504, 506 and one or more inductor inter-metal vias 508, 510 arranged between the inductor metal layers 502, 504, 506. In some embodiments, a topmost inductor metal layer 506 of the inductor 110 has a thickness $Th_{m,top}$ exceeding a thickness $Th_{m,und}$ of the one or more underlying inductor metal layers 502, 504, and/or has a lower conductivity than the underlying inductor metal layer(s) 502, 504. Further, in some embodiments, a topmost inductor inter-metal via 510 of the inductor 110 has a thickness $Th_{v,top}$ exceeding a thickness $Th_{v,und}$ of any underlying inductor inter-metal vias 508 of the inductor 110, and/or has a lower conductivity than any underlying inductor inter-metal vias 508 of the inductor 110.

A first end of the inductor 110 is electrically coupled to an inductor-power inter-metal via 514, and a second end of the inductor 110 is electrically coupled to a plurality of capacitor-inductor inter-metal vias 516, 602. The inductor-power inter-metal via 514 electrically couples the inductor 110 to an underlying power mesh 112, and the capacitor-inductor inter-metal vias 516, 602 electrically couple the inductor 110 to an underlying capacitor (not shown). In some embodiments, the inductor-power inter-metal via 514 and/or the capacitor-inductor inter-metal vias 516, 602 are thinner than the inductor inter-metal via(s) 508, 510, and/or have lower conductivities than the inductor inter-metal via(s) 508, 510. Further, in some embodiments, the inductor-power inter-metal via 514 and/or a first capacitor-inductor inter-metal via 516 are thicker than a second capacitor-inductor inter-metal via 602 thereunder, and/or have higher conductivities than the second capacitor-inductor inter-metal via 602.

The power mesh 112 underlies the inductor 110 and neighbors a ground mesh 114. In some embodiments, the power and ground meshes 112, 114 are thinner than the inductor metal layers 502, 504, 506. Further, in some embodiments, the power and ground meshes 112, 114 have lower conductivities than the inductor metal layers 502, 504, 506.

With reference to FIGS. 7A-7H, top views 700A-700H of various embodiments of the inductor 110 of FIG. 1 are provided.

Figure 7A:
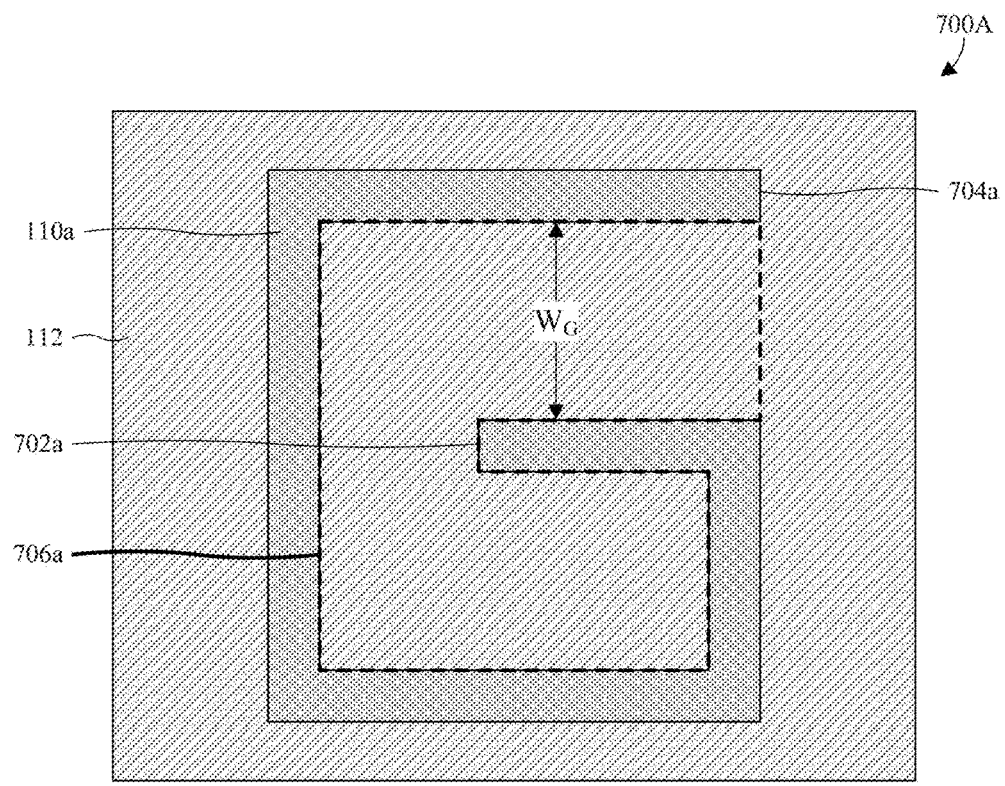
FIGS. 7A-7H illustrate top views of various embodiments of an inductor of FIG. 1.

As illustrated by FIG. 7A, a G-shaped inductor 110a is provided. The G-shaped inductor 110a is shaped according to the letter "G" and extends between first and second ends 702a, 704a. Sidewalls of the G-shaped inductor 110a define a trench 706a that is, in some embodiments, shaped according to the letter "C". A first end of the trench 706a is closed by a sidewall of the G-shaped inductor 110a, and a second end of the trench 706a that is opposite the first end is open. In some embodiments, a width $W_G$ of the trench 706a is substantially uniform along the length of the trench 706a.

Figure 7B:
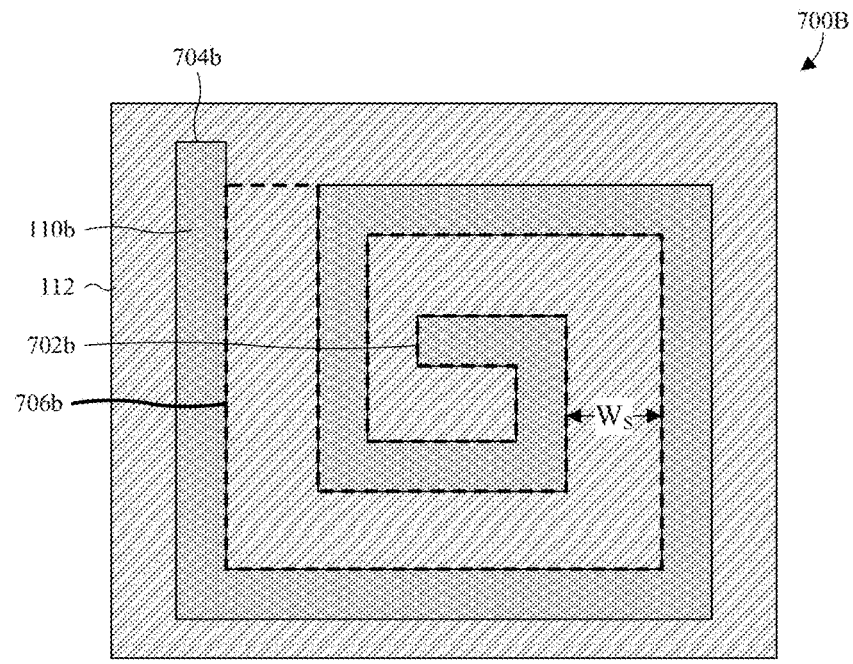

As illustrated by FIG. 7B, a spiral inductor 110b is provided. The spiral inductor 110b extends from a first end 702b at a center of the spiral inductor 110b to a second end 704b at a periphery of the spiral inductor 110b, while spiraling outward from the center of the spiral inductor 110b. In some embodiments, the spiral inductor 110b spirals around the center about 660-720 degrees. Sidewalls of the spiral inductor 110b define a spiral trench 706b that is closed at a first end and open at an opposing second end. In some embodiments, a width $W_S$ of the spiral trench 706b is substantially uniform along the length of the spiral trench 706b.

Figure 7C:
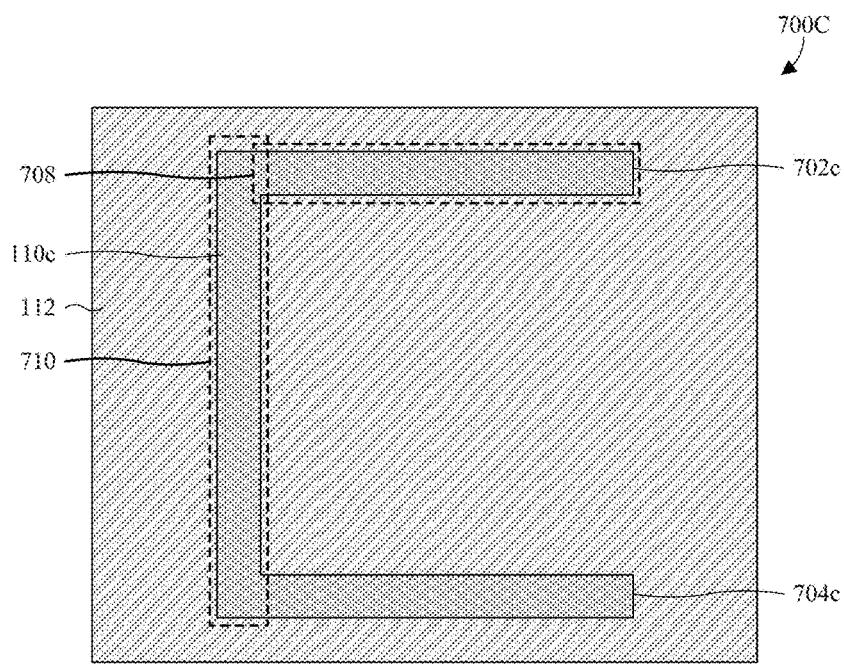

As illustrated by FIG. 7C, a C-shaped inductor 110c is provided. The C-shaped inductor 110c is shaped according to the letter "C" and extends between first and second ends 702c, 704c. In some embodiments, the C-shaped inductor 110c comprises a pair of first line segments 708 parallel to one another and orthogonal to a second line segment 710.

Figure 7D:
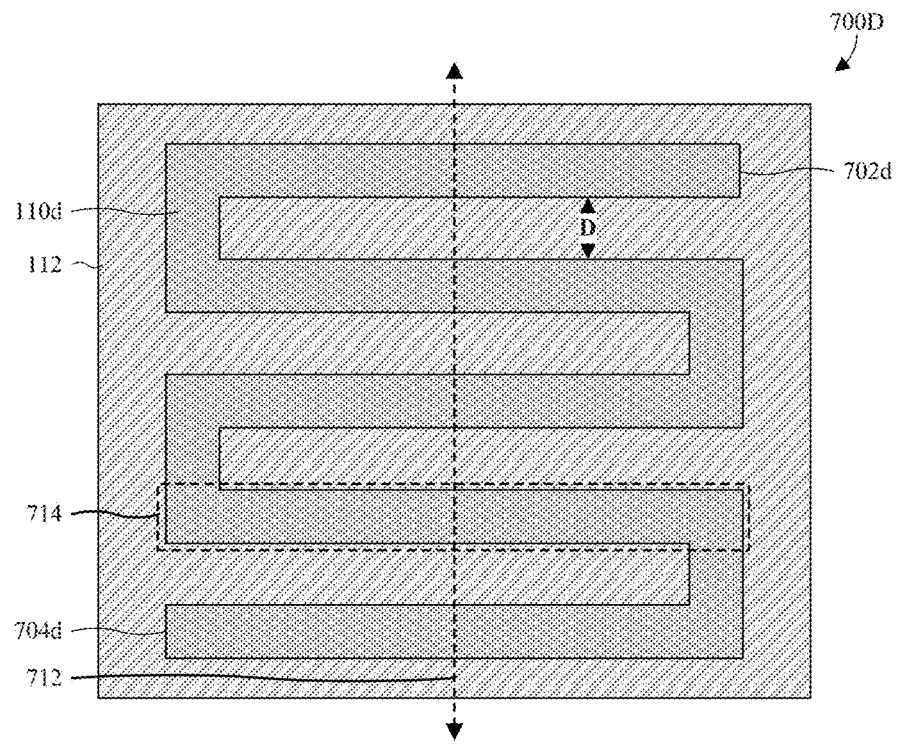

As illustrated by FIG. 7D, a meandering inductor 110d is provided. The meandering inductor 110d meanders between a first end 702d and a second end 704d by repeatedly extending back and forth in a direction normal to an axis 712, while extending in parallel with the axis 712 before and/or after each back and forth extension 714. In some embodiments, a distance D between the back and forth extensions 714 is substantially uniform along the axis 712, and/or centroids of the back and forth extensions 714 are aligned along the axis 712. Further, in some embodiments, the back and forth extensions 714 share a common footprint.

In some embodiments, the shapes of FIGS. 7A-D can be duplicated and combined into a composite inductor to increase inductance. For example, multiple instances of the G-shaped inductor of FIG. 7A can be combined into a composite inductor.

Figure 7E:
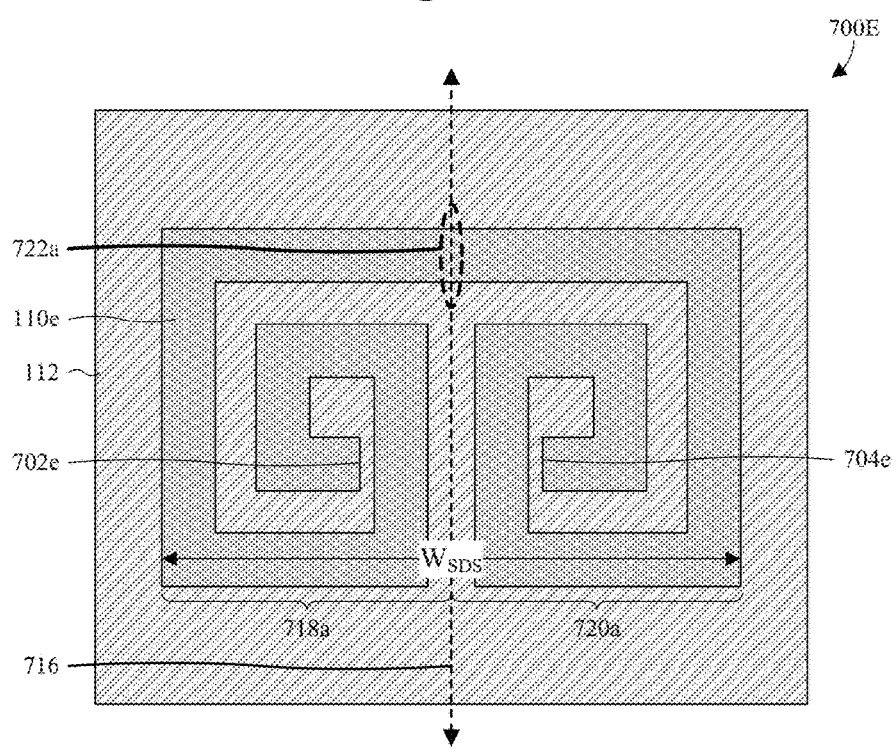

As illustrated by FIG. 7E, a symmetrical-double-spiral inductor 110e is provided. The symmetrical-double-spiral inductor 110e is symmetrical about an axis 716 bisecting a width $W_{SDS}$ of the symmetrical-double-spiral inductor 110e. Further, the symmetrical-double-spiral inductor 110e comprises a pair of spiral regions 718a, 720a that are laterally adjacent to one another. The spiral regions 718a, 720a spiral outward in opposite directions from opposing ends 702e, 704e of the symmetrical-double-spiral inductor 110e that are arranged at centers of the spiral regions 718a, 720a. After spiraling outward, the spiral regions 718a, 720a meet at a common location 722a between the spiral regions 718a, 720a. In some embodiments, the spiral regions 718a, 720a individually have the spiral structure described in connection with FIG. 7B.

Figure 7F:
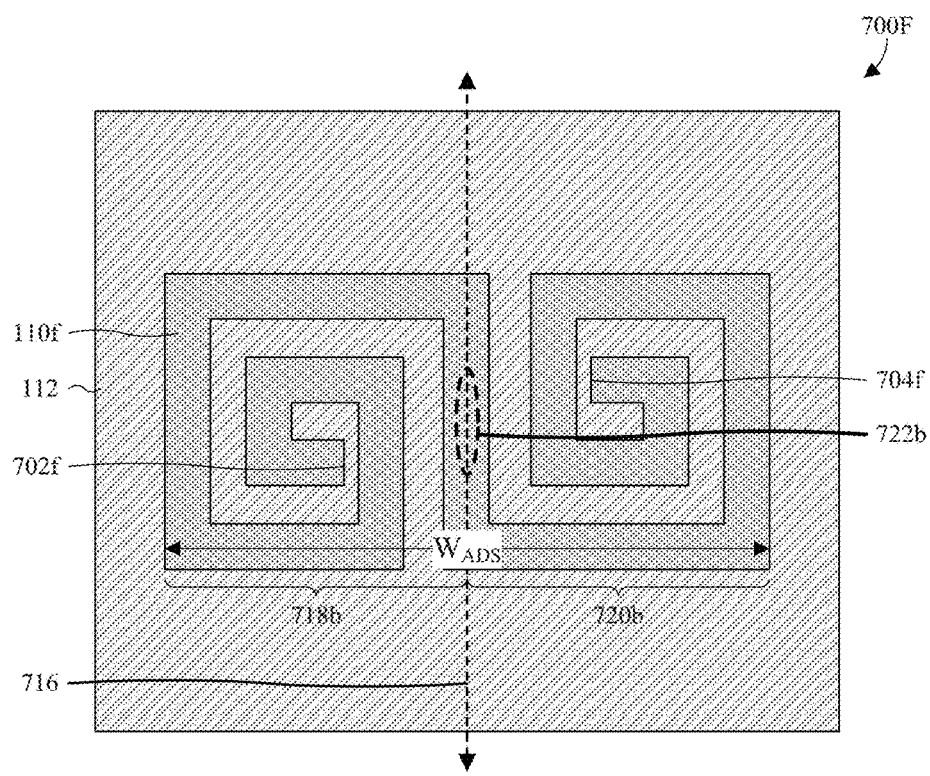

As illustrated by FIG. 7F, an asymmetrical-double-spiral inductor 110f is provided. The asymmetrical-double-spiral inductor 110f is asymmetrical about an axis 716 bisecting a width $W_{ADS}$ of the asymmetrical-double-spiral inductor 110f. Further, the asymmetrical-double-spiral inductor 110f comprises a pair of spiral regions 718b, 720b that are laterally adjacent to one another. The spiral regions 718b, 720b spiral outward in the same direction from opposing ends 702f, 704f of the asymmetrical-double-spiral inductor 110f that are arranged at centers of the spiral regions 718b, 720b. After spiraling outward, the spiral regions 718b, 720b meet at a common location 722b between the spiral regions 718b, 720b. In some embodiments, the spiral regions 718b, 720b individually have the spiral structure described in connection with FIG. 7B.

Figure 7G:
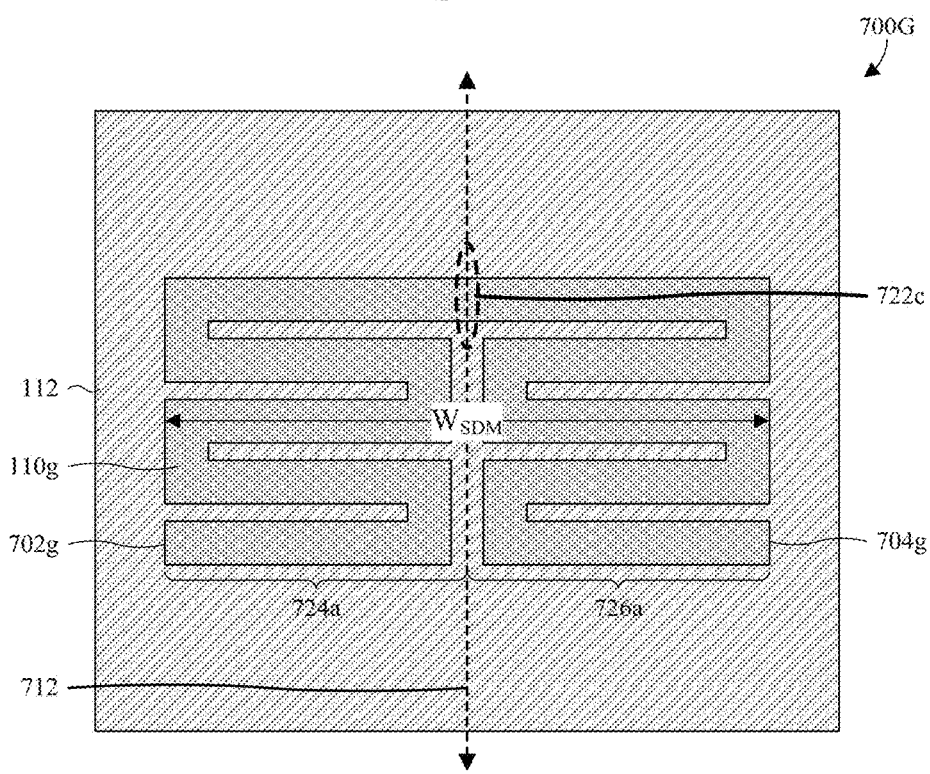

As illustrated by FIG. 7G, a symmetrical-double-meandering inductor 110g is provided. The symmetrical-double-meandering inductor 110g is symmetrical about an axis 712 bisecting a width $W_{SDM}$ of the symmetrical-double-meandering inductor 110g. Further, the symmetrical-double-meandering inductor 110g comprises a pair of meandering regions 724a, 726a that are laterally adjacent to one another. The meandering regions 724a, 726a meander from respective ends 702g, 704g of the symmetrical-double-meandering inductor 110g to a common location 722c between the meandering regions 724a, 726a. The meandering includes repeatedly extending back and forth in a direction normal to the axis 712, while extending in parallel with the axis 712 before and/or after each back and forth extension. In some embodiments, the ends 702g, 704g of the symmetrical-double-meandering inductor 110g are on a common side and/or laterally opposite corners of the symmetrical-double-meandering inductor 110g, and/or the common location 722c is on a side of the symmetrical-double-meandering inductor 110g that is opposite the common side. In some embodiments, the meandering regions 724a, 726a individually have the meandering structure described in connection with FIG. 7D.

Figure 7H:
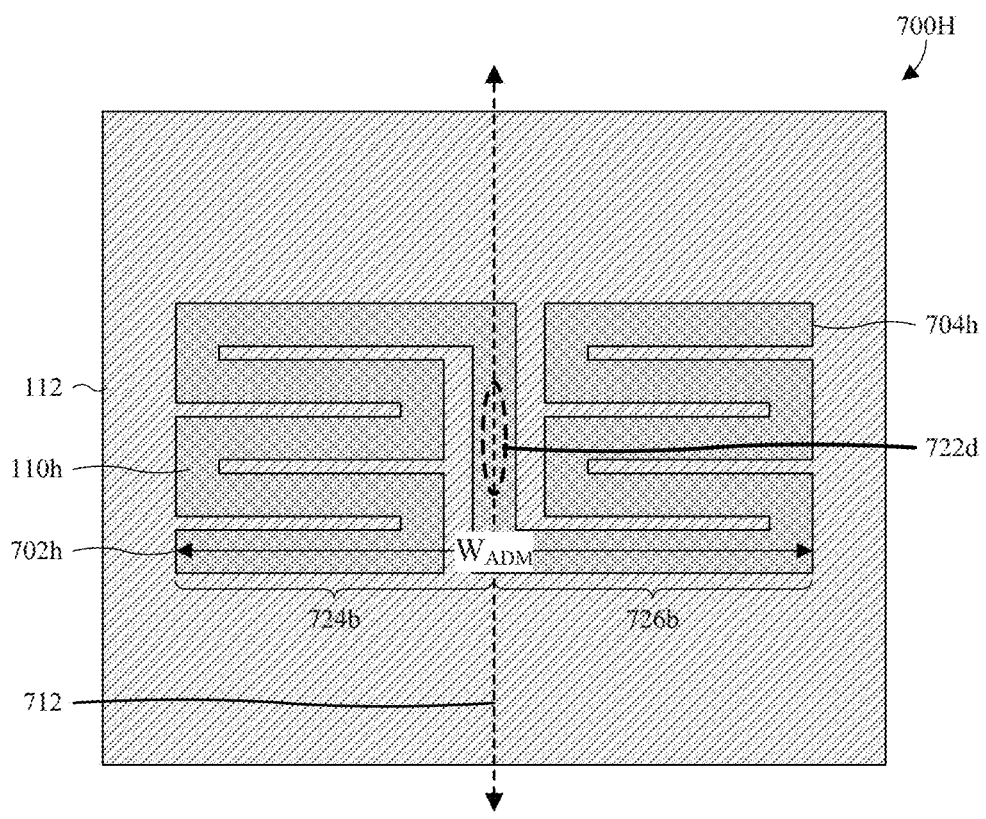

As illustrated by FIG. 7H, an asymmetrical-double-meandering inductor 110h is provided. The asymmetrical-double-meandering inductor 110h is asymmetrical about an axis 712 bisecting a width $W_{ADM}$ of the asymmetrical-double-meandering inductor 110h. Further, the asymmetrical-double-meandering inductor 110h comprises a pair of meandering regions 724b, 726b that are laterally adjacent to one another. The meandering regions 724b, 726b meander from respective ends 702h, 704h of the asymmetrical-double-meandering inductor 110h to a common location 722d between the meandering regions 724b, 726b. The meandering includes repeatedly extending back and forth normal to the axis 712, while extending in parallel with the axis 712 before and/or after each back and forth extension. In some embodiments, the ends 702h, 704h of the asymmetrical-double-meandering inductor 110h are on opposite sides and/or diagonally opposite corners of the asymmetrical-double-meandering inductor 110h, and/or the common location 722d is arranged between the opposite sides. Further, in some embodiments, the meandering regions 724b, 726b individually have the meandering structure described in connection with FIG. 7D.

In some embodiments, the inductors 110a-110h of FIGS. 7A-7H can be combined in different combinations to increase inductance. For example, the G-shaped inductor 110a of FIG. 7A can be combined with the meandering inductor 110d of FIG. 7D. Further, in some embodiments, the inductors 110a-110h of FIGS. 7A-7H have uniform line widths (e.g., of about 5-10 micrometers), and/or are defined by a plurality of line segments arranged end to end (e.g., at about 90 degree angles).

Figure 8:
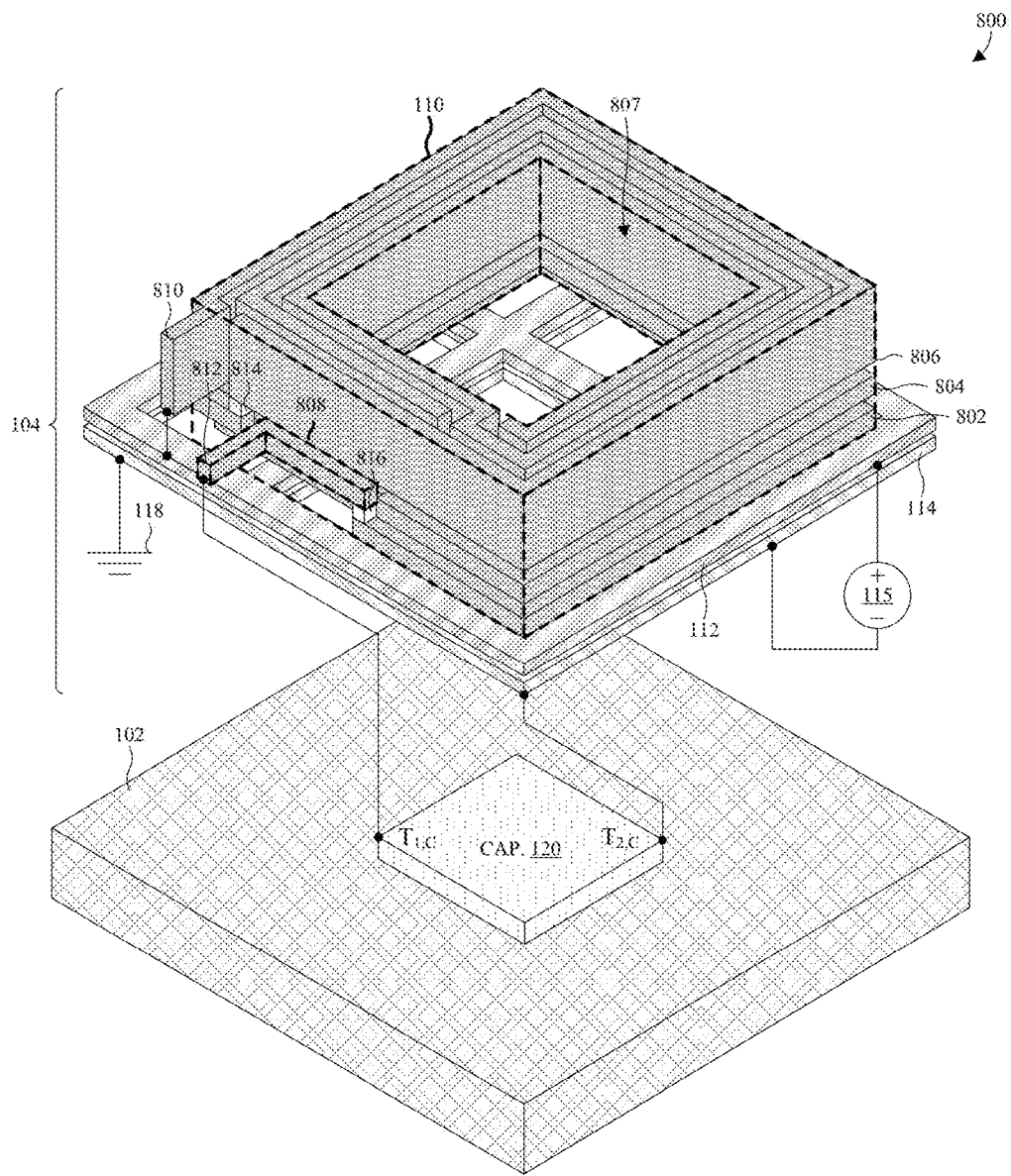
FIG. 8 illustrates a perspective view of some more detailed embodiments the EBG structure of FIG. 1.

With reference to FIG. 8, a perspective view 800 of some more detailed embodiments the EBG structure of FIG. 1 is provided. As illustrated, an inductor 110 is arranged over power and ground meshes 112, 114, and defined by a plurality of inductor metal layers 802, 804, 806 of a BEOL region 104 that are stacked upon one another. In some embodiments, the inductor 110 has a ring-shaped (e.g., square ring-shaped) footprint and/or a substantially uniform line width. For example, the inductor 110 may laterally surround a central opening 807 with a substantially uniform line width. Further, in some embodiments, the inductor metal layers 802, 804, 806 are topmost metal layers of the BEOL region 104.

The inductor metal layers 802, 804, 806 comprise corresponding inductor segments 808 that are continuous, elongated regions of the inductor metal layers 802, 804, 806. The inductor segments 808 may, for example, be individually shaped according to one or more of the inductors 110a-110h of FIGS. 7A-7H. Further, the inductor segments 808 of an individual inductor metal layer 802, 804, 806 may, for example, be arranged end to end so as to individually and/or collectively define an inward spiraling and/or ring-shaped structure (e.g., a square ring-shaped structure). The inductor segments 808 are connected in series between a first end 810 (or terminal) of the inductor 110 and a second end 812 (or terminal) of the inductor 110 by one or more inductor inter-metal vias 814, 816 arranged between the inductor metal layers 802, 804, 806, such that the length of the inductor 110 spans three dimensions. In some embodiments, the inductor segments 808 are connected end to end by the inductor via(s) 814, 816 and/or connected ends of the inductor segments 808 overlap. Further, in some embodiments, the inductor segments 808 are connected such that current flows in a common direction from the first end 810 of the inductor 110 to the second end 812 of the inductor 110. Advantageously, distributing the length of the inductor 110 amongst multiple inductor metal layers 802, 804, 806 allows the inductance of the inductor 110 to be increased, without increasing the footprint size.

The power and ground meshes 112, 114 underlie the inductor 110. The power mesh 112 is electrically connected to the first end 810 of the inductor 110, and the ground mesh 114 is electrically connected to ground 118. Further, one or more capacitors 120 underlie the power and ground meshes 112, 114, and are collectively connected between the ground mesh 114 and the second end 812 of the inductor 110.

Figure 9:
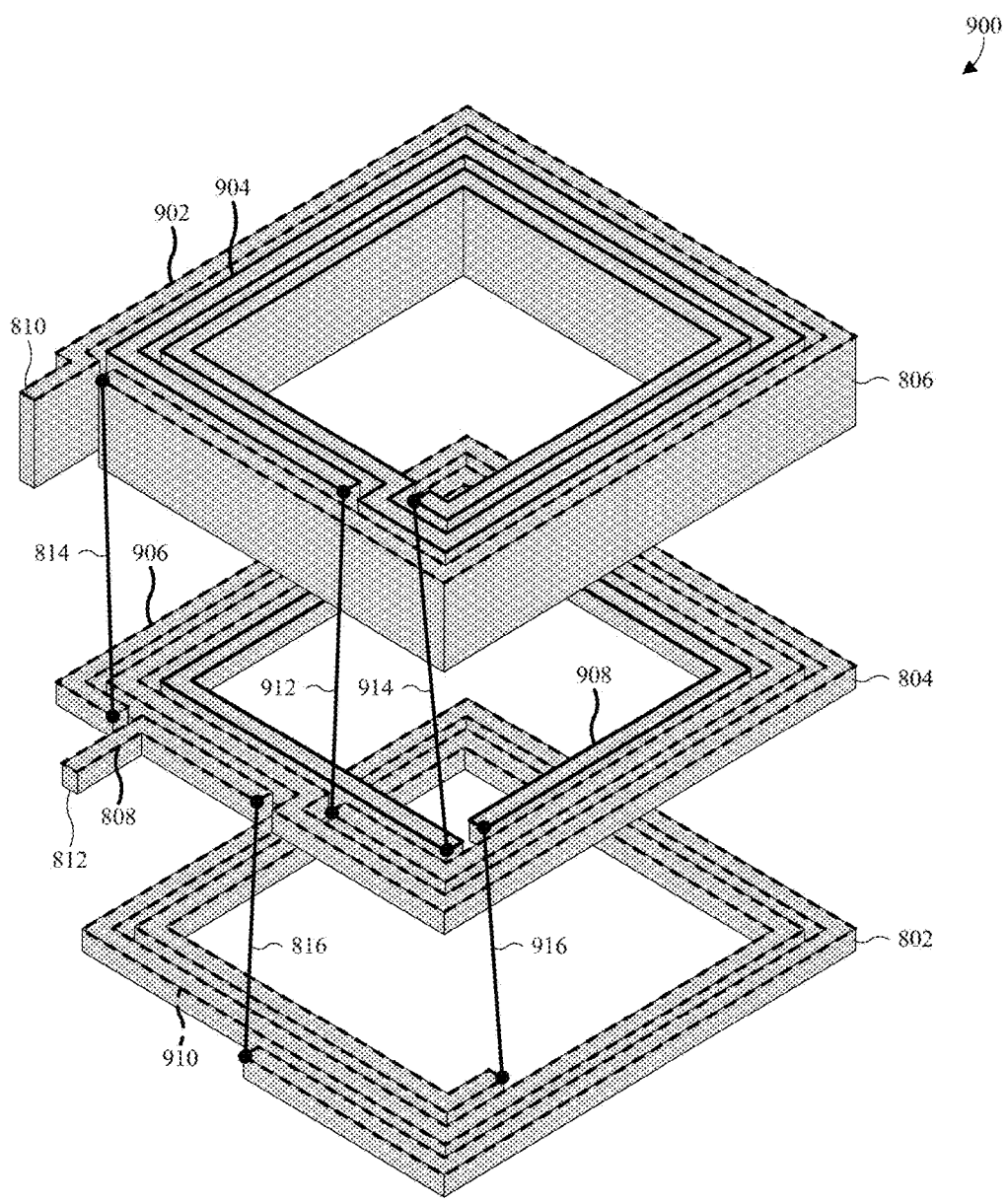
FIG. 9 illustrates a perspective view of an inductor of FIG. 8.

With reference to FIG. 9, a perspective view 900 of some embodiments of the inductor 110 of FIG. 8 is provided. As illustrated, a first inductor metal layer 806 of the inductor 110 comprises a first outer inductor segment 902 and a first inner inductor segment 904. The first outer inductor segment 902 laterally surrounds the first inner inductor segment 904, and the first inner inductor segment 904 spirals inward. For example, the first inner inductor segment 904 may spiral inward about 660-720 degrees. In some embodiments, the first inner inductor segment 904 and/or the first outer inductor segment 902 have ring-shaped footprints (e.g., square or rectangle ring-shaped footprints).

A second inductor metal layer 804 underlies the first inductor metal layer 806, and comprises second and third outer inductor segments 808, 906 and a second inner inductor segment 908. The second and third outer inductor segments 808, 906 laterally surround the second inner inductor segment 908. Further, the second outer inductor segment 906 spirals inward. For example, the second outer inductor segment 906 may spiral inward about 660-720 degrees. The second inner inductor segment 908 lines sidewalls of the second outer inductor segment 906. In some embodiments, the second inner inductor segment 908 and/or the second outer inductor segment 906 have ring-shaped footprints.

A third inductor metal layer 802 underlies the second inductor metal layer 804 and comprises a fourth outer inductor segment 910. The fourth outer inductor segment 910 spirals inward and, in some embodiments, spirals inward about 660-780 degrees. In some embodiments, the fourth outer inductor segment 910 has a ring-shaped footprint.

The inductor segments 808, 902-910 are connected in series between first and second ends 810, 812 of the inductor 110. The first end 810 of the inductor 110 is defined by a first end of the first outer inductor segment 902, and the second end 812 of the inductor 110 is defined by a first end of the third outer inductor segment 808. The inductor segment 808, 902-910 are connected in series by inductor inter-metal vias 814, 816 arranged between the first, second, and third metal inductor layers 802, 804, 806.

In some embodiments, the inductor segments 808, 902-910 are connected in series between the first and second ends 810, 812 of the inductor 110 as follows. A first inductor inter-metal via 814 electrically couples a second end of the first outer inductor segment 902 to a first end of the second outer inductor segment 906. A second inductor inter-metal via 912 electrically couples a first end of the first inner inductor segment 904 to a second end of the second outer inductor segment 906. A third inductor inter-metal via 914 electrically couples a second end of the first inner inductor segment 904 to a first end of the second inner inductor segment 908. A fourth inductor inter-metal via 816 electrically couples a second end of the third outer inductor segment 808 to a first end of the fourth outer inductor segment 910. A fifth inductor inter-metal via 916 electrically couples a second end of the second inner inductor segment 908 to a second end of the fourth outer inductor segment 910.

Figure 10:
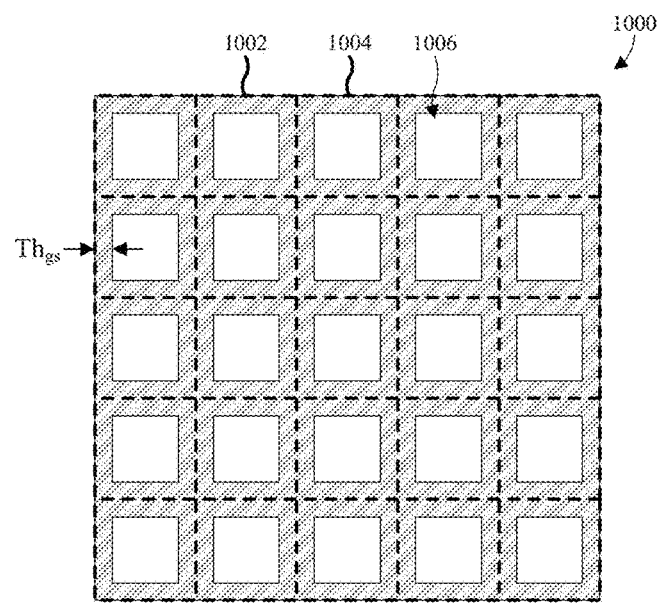
FIG. 10 illustrates a top view of some embodiments of a mesh structure of FIG. 1.

With reference to FIG. 10, a top view 1000 of some embodiments of a mesh structure that may be used for the power and/or the ground meshes 112, 114 of FIG. 1 is provided. As illustrated, the mesh structure comprises a plurality of adjoining mesh segments 1002, 1004 (i.e., regions) arranged in rows and columns, such as, for example, the illustrated 5 rows and 5 columns. The mesh segments 1002, 1004 laterally surround corresponding openings 1006 and, in some embodiments, share a common footprint. For example, the mesh segments 1002, 1004 may share a square-ring shaped footprint. Further, in some embodiments, the mesh segments 1002, 1004 comprise substantially uniform thicknesses $Th_{gs}$ around the openings 1006.

In some embodiments where the mesh structure is used for transferring power between a power source and a load (not shown), the mesh structure is configured as a matching network for impedance matching the power source with the load over a wide range of frequencies. For example, the material of the mesh structure and/or the density (e.g., a ratio of material area to open area) of the mesh structure may be adjusted for impedance matching. In some embodiments, the mesh structure is metal and/or the material density of the mesh structure is about 40-60%, such as, for example, about 50%.

Figure 11A:
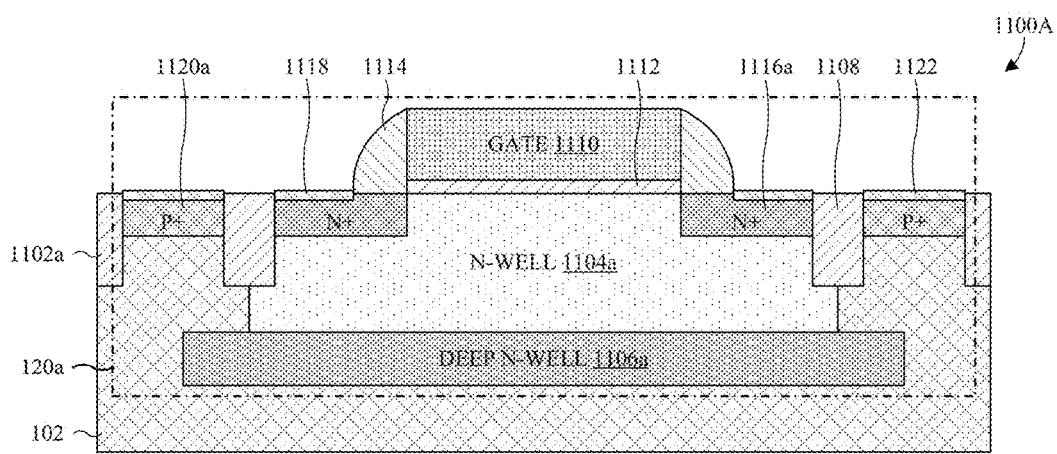
FIGS. 11A and 11B illustrate cross-sectional views of various embodiments of a capacitor of FIG. 1.
Figure 11B:
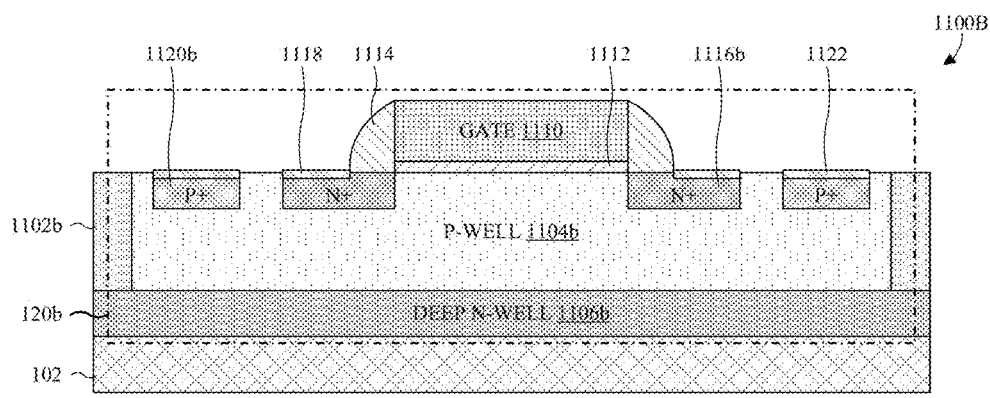

With reference to FIGS. 11A and 11B, cross-sectional views 1100A, 1100B of various embodiments of a capacitor 120 of FIG. 1 are provided.

As illustrated by FIG. 11A, a MOS varactor 120a is arranged on an upper side of a semiconductor substrate 102 within a doped region of a first doping type (e.g., n- or p-type). For example, the bulk of the semiconductor substrate 102 may have the first doping type and the MOS varactor 120a may be arranged directly in the bulk of the semiconductor substrate 102. As another example, the semiconductor substrate 102 may comprise a device well region (not shown) with the first doping type and the MOS varactor 120a may be arranged directly in the device well region. Further, in some embodiments, the MOS varactor 120a is laterally surrounded by a first isolation region 1102a. The first isolation region 1102a may be, for example, a shallow trench isolation (STI) or deep trench isolation (DTI) region, and/or may have, for example, a ring-shaped footprint.

The MOS varactor 120a comprises a first well region 1104a and a second well region 1106a both sharing a second doping type that is opposite the first doping type. The first well region 1104a abuts an upper surface of the semiconductor substrate 102 and, in some embodiments, is laterally surrounded by a second isolation region 1108. The second isolation region 1108 may be, for example, a STI region and/or may have, for example, a ring-shaped footprint. The second well 1106a is deeply buried under the first well region 1104a and has a higher doping concentration than the first well region 1104a to advantageously define a high junction barrier for reduced leakage.

A gate 1110 is arranged over the first well region 1104a, and spaced from the first well region 1104a by a gate dielectric structure 1112. Further, sidewalls of the gate 1110 and the gate dielectric structure 1112 are lined by a spacer structure 1114. In some embodiments, the spacer structure 1114 laterally surrounds the gate 1110 and the gate dielectric structure 1112, and/or has a ring-shaped footprint. The gate 1110 may be, for example, doped polysilicon and is, in some embodiments, electrically coupled to an inductor 110 in FIG. 1.

First contact regions 1116a of the second doping type are arranged in the first well region 1104a, on opposing sides of the gate 1110. The first contact regions 1116a have a higher doping concentration than the first well region 1104a and, in some embodiments, are at least partially covered by first silicide structures 1118. Further, one or more second contact regions 1120a of the first doping type are arranged in the bulk of the semiconductor substrate 102 or the device well region, between the first and second isolation regions 1102a, 1108. The second contact region(s) 1120a have a higher doping concentration than the bulk of the semiconductor substrate 102 or the device well region and, in some embodiments, are at least partially covered by second silicide structures 1122. Further, in some embodiments, the second contact region(s) 1120a comprise a single second contact region laterally surrounding the first well region 1104a and/or having a ring-shaped footprint. The silicide structures 1118, 1122 and/or the contact regions 1116a, 1120a are electrically coupled together and, in some embodiments, electrically coupled to a ground mesh 114 in FIG. 1.

As illustrated by FIG. 11B, a MOS capacitor 120b is arranged on an upper side of a semiconductor substrate 102, and comprises a first well region 1104b and a second well region 1106b. The first well region 1104b abuts an upper surface of the semiconductor substrate 102 and has a first doping type. Further, in some embodiments, the first well region 1104b is laterally surrounded by an isolation region 1102b. The isolation region 1102b may be, for example, a STI region and/or a doped region with a second doping type that is opposite the first doping type. The second well region 1106b is deeply buried under the first well region 1104b and has the second doping type. In some embodiments the second well region 1106b has a higher doping concentration than the first well region 1104b and/or the isolation region 1102b.

A gate 1110 is arranged over the first well region 1104b, and spaced from the first well region 1104b by a gate dielectric structure 1112. Further, sidewalls of the gate 1110 and the gate dielectric structure 1112 are lined by a spacer structure 1114.

First contact regions 1116b of the second doping type are arranged in the first well region 1104b, on opposing sides of the gate 1110. The first contact regions 1116b have a higher doping concentration than the first well region 1104b and, in some embodiments, are at least partially covered by first silicide structures 1118. Further, one or more second contact regions 1120b of the first doping type are arranged in the first well region 1104b. The second contact region(s) 1120b have a higher doping concentration than the first well region 1104b and, in some embodiments, are at least partially covered by second silicide structures 1122. Further, in some embodiments, the second contact region(s) 1120b comprise a single second contact region laterally surrounding the first contact region 1116b and/or having a ring-shaped footprint. The silicide structures 1118, 1122 and/or the contact regions 1116b, 1120b are electrically coupled together and, in some embodiments, electrically coupled to a ground mesh 114 in FIG. 1.

Figure 12:
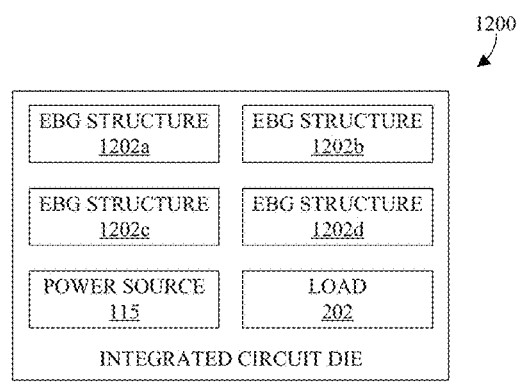
FIG. 12 illustrates a block diagram of some embodiments of an integrated circuit (IC) die comprising one or more EBG structures.

With reference to FIG. 12, a block diagram of some embodiments of an IC die is provided. The IC die may, for example, be used within SoCs and/or SiPs. As illustrated, the IC die comprises one or more EBG structures 1202a-1202d according to the foregoing embodiments for noise suppression on power and ground meshes of the EBG structure(s) 1202a-1202d. The power and ground meshes of the EBG structures 1202a-1202d are connected to a power source 115 and one or more loads 202 are connected to the power and ground meshes.

In some embodiments where the EBG structure(s) 1202a-1202d comprise multiple EBG structures, the EBG structure(s) 1202a-1202d are arranged in rows and columns with the power meshes of the EBG structure(s) 1202a-1202d interconnected and the ground meshes of the EBG structure(s) 1202a-1202d interconnected. Further, in some embodiments where the EBG structure(s) 1202a, 1202d comprise multiple EBG structures, the power meshes of the EBG structure(s) 1202a-1202d may be integrated together into a common power mesh, and/or the ground meshes of the EBG structure(s) 1202a-1202d may be integrated together into a common ground mesh. The use of multiple EBG structures advantageously improves noise suppression on the power and ground meshes.

Figure 13A:
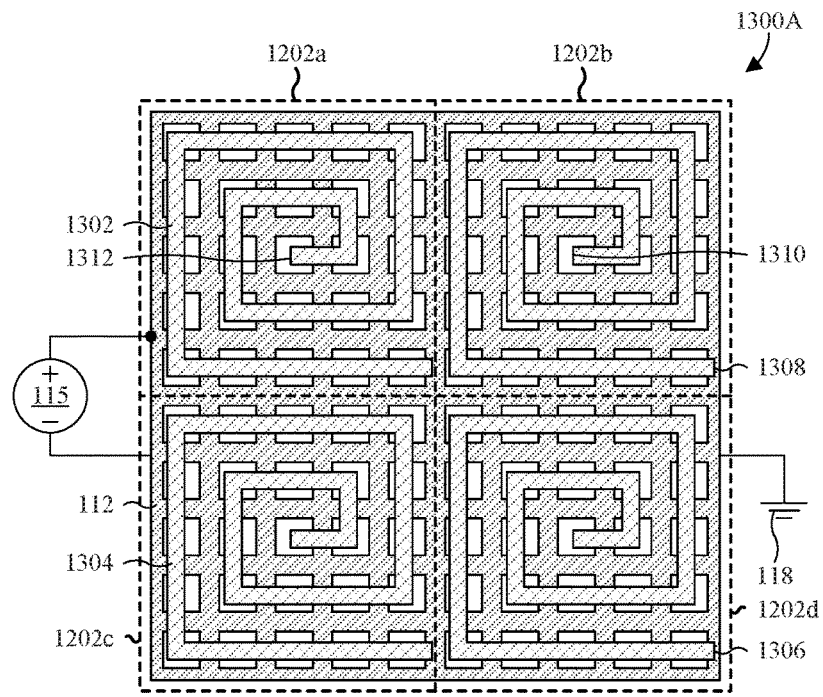
FIGS. 13A and 13B respectively illustrate top and bottom views of some embodiments of the EBG structure(s) of FIG. 12.
Figure 13B:
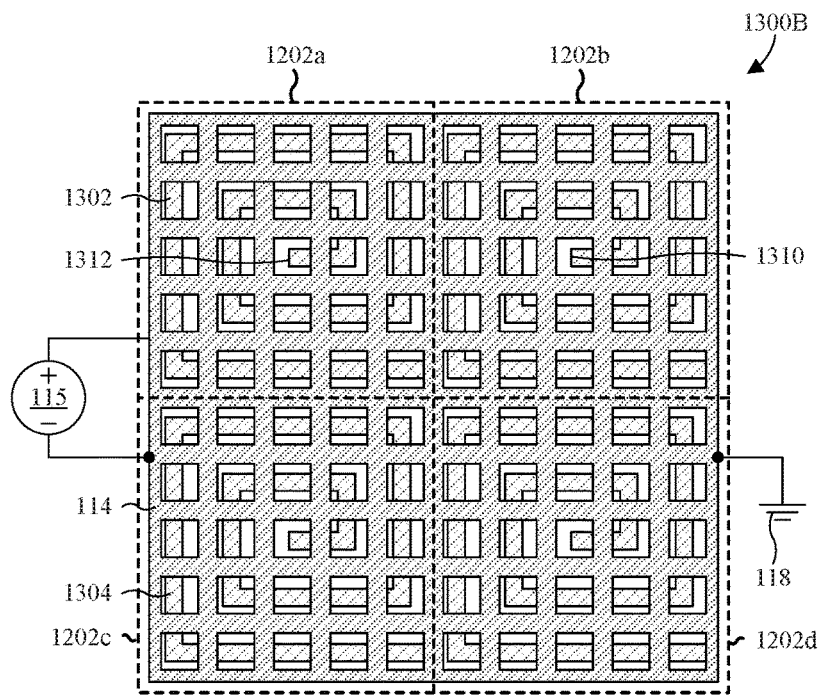

With reference to FIGS. 13A and 13B, top and bottom views 1300A, 1300B of some embodiments of the EBG structure(s) of FIG. 12 are provided.

As illustrated by FIG. 13A, the noise suppression structure comprises a plurality of EBG structures 1202a-1202d, such as, for example, the 4 illustrated EBG structures. The EBG structures 1202a-1202d comprise individual inductors 1302, 1304 arranged over a power mesh 112, and further comprise individual capacitors (not shown) arranged under the inductors 1302, 1304. The inductors 1302, 1304 comprise first ends 1306, 1308 electrically coupled to the power mesh 112, and further comprise second ends 1310, 1312 electrically coupled to the capacitors. In some embodiments, the power mesh 112 is configured according to the mesh structure of FIG. 10. Further, in some embodiments, the inductors 1302, 1304 are configured according to embodiments of FIG. 5, 7A-7H, or 8.

As illustrated by FIG. 13B, a ground mesh 114 underlies the power mesh 112 (see FIG. 13A) and is electrically coupled to the capacitors (not shown), such that the capacitors are connected between the inductors 1302, 1304 and the ground mesh 114. The ground mesh 114 is spaced from the power mesh 112 by a dielectric layer (not shown) and is, in some embodiments, configured according to the mesh structure of FIG. 10.

A power source 115 is connected between the power and ground meshes 112, 114 (respectively see FIGS. 13A and 13B), such that the power and ground meshes 112, 114 act as transmission lines to a load (not shown) connected to the power and ground meshes 112, 114. As noted above, parameters of the power and ground meshes 112, 114, such as material density, can be tuned for impedance matching. Further, the inductors 1302, 1304 are connected to the power mesh 112 at points intermediate the power source 115 and the load to suppress noise. While a single EBG filter is effective at suppressing noise, multiple EBG filters advantageously enhances noise suppression.

Figure 14A:
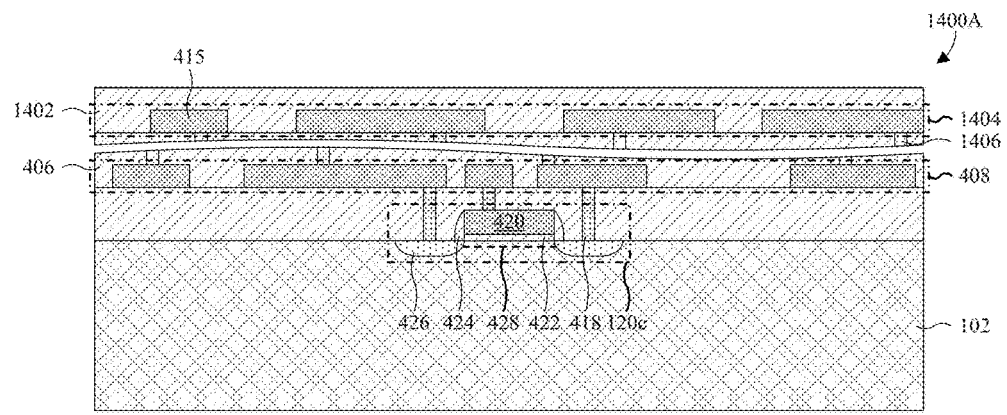
FIGS. 14A, 14B, and 15-17 illustrate cross-sectional views of some embodiments of an EBG structure at various stages of manufacture.
Figure 14B:
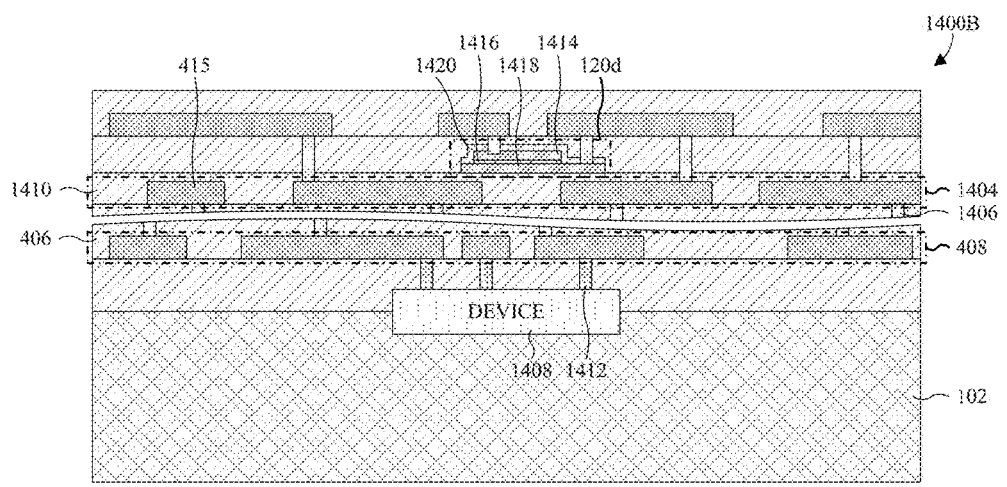

With reference to FIGS. 14A, 14B, and 15-17, cross-sectional views 1400A, 1400B, 1500-1700 of some embodiments of the EBG structure of FIG. 1 at various stages of manufacture are provided. Further, FIGS. 14A and 14B are directed to alternative embodiments of forming a capacitor for the EBG structure.

As illustrated by FIG. 14A, a FEOL capacitor 120c is formed in an upper side of semiconductor substrate 102. The semiconductor substrate 102 may be, for example, a bulk silicon substrate or a SOI substrate. The FEOL capacitor 120c may be, for example, an n- or p-type MOS capacitor, an n- or p-type MOS varactor, or an n- or p-type diode-based capacitor. The diode-based capacitor may be, for example, be based on a gated diode or an STI diode.

In some embodiments, the process for forming the FEOL capacitor 120c includes sequentially depositing or otherwise forming a first dielectric layer and a conductive layer stacked over the semiconductor substrate 102. A selective etch is performed into the conductive and first dielectric layers to respectively form a gate structure 420 and a gate dielectric structure 422. A second dielectric layer is conformally deposited or otherwise formed lining the gate and gate dielectric structures 420, 422, and subsequently etched back to form a spacer structure 424 lining sidewalls of the gate and gate dielectric structures 420, 422. With the spacer structure 424 formed, source/drain regions 426 are implanted or otherwise formed on opposing sides of the gate and gate dielectric structures 420, 422 to define a channel region 428 underlying the gate and gate dielectric structures 420, 422.

Also illustrated by FIG. 14A, a plurality of ILD layers 406, 1402 and a plurality of metal layers 408, 1404 are formed stacked over the FEOL capacitor 120c. The ILD layers 406, 1402 may be formed of, for example, a low κ dielectric material or an oxide. Further, the ILD layers 406, 1402 may be individually formed by, for example, a process comprising an ILD deposition followed by a planarization (e.g., a chemical mechanical polish (CMP)) of the deposition. The metal layers 408, 1404 comprise metal features, such as, for example, metal lines 415, and are formed between the ILD layers 406, 1402. The metal layers 408, 1404 may be formed of, for example, aluminum copper, copper, or some other metal. Further, the metal layers 408, 1404 may be individually formed by, for example, a process comprising a metal deposition followed by a selective etch of the metal deposition.

Also illustrated by FIG. 14A, inter-metal vias 1406 and contact vias 418 are formed between the metal layers 408, 1404, through the ILD layers 406, 1402. The contact vias 418 electrically couple the metal layers 408, 1404 to the FEOL capacitor 120c, and the inter-metal vias 1406 electrically couple the metal layers 408, 1404 to one another. The inter-metal vias 1406 and the contact vias 418 may be formed of, for example, copper, aluminum copper, aluminum, or some other metal. Further, individual layers or levels of the inter-metal and/or contact vias 418, 1406 may be formed by, for example, a process comprising a selective etch into an ILD layer, a deposition into openings formed by the selective etch, and an etch and/or a planarization of the deposition.

As illustrated in FIG. 14B, one or more electronic devices 1408 are formed in an upper side of a semiconductor substrate 102. The electronic device(s) 1408 may comprise, for example, one or more of transistors, diodes, memory cells, capacitors (e.g., the FEOL capacitor 120c of FIG. 14A), and so on. Further, a plurality of ILD layers 406, 1410 and a plurality of metal layers 408, 1404 are formed stacked over the electronic device(s) 1408. The metal layers 408, 1404 comprise metal features and are formed between the ILD layers 406, 1410. Further, the metal layers 408, 1404 are formed interconnected by inter-metal vias 1406, and connected to the electronic device(s) 1408 by contact vias 1412. In some embodiments, one or more of the ILD layers 406, 1410, the metal layers 408, 1404, and the inter-metal and/or contact vias 1406, 1412 are formed as described in FIG. 14A.

Also illustrated by FIG. 14B, a BEOL capacitor 120d is formed between a pair of the metal layers 1404 while forming the ILD layers 406, 1410 and the metal layers 408, 1404. Further, the BEOL capacitor 120d is formed electrically coupled to the metal layers 408, 1404 by the inter-metal vias 1406. The BEOL capacitor 120d may be, for example, a MOM capacitor or a MIM capacitor.

In some embodiments, the process for forming the BEOL capacitor 120d comprises sequentially depositing or otherwise forming a pair of conductive layers and a first dielectric layer stacked over an ILD layer 1410 with the first dielectric layer arranged between the conductive layers of the pair. A first etch is selectively performed into a topmost conductive layer of the pair and the first dielectric layer to respectively form an upper electrode 1414 and a dielectric structure 1416. A second dielectric layer is conformally deposited or otherwise formed lining the upper electrode 1414 and the dielectric structure 1416. A second etch is selectively performed into the second dielectric layer and a bottommost conductive layer of the pair to form a lower electrode 1418 and a capping structure 1420.

Figure 15:
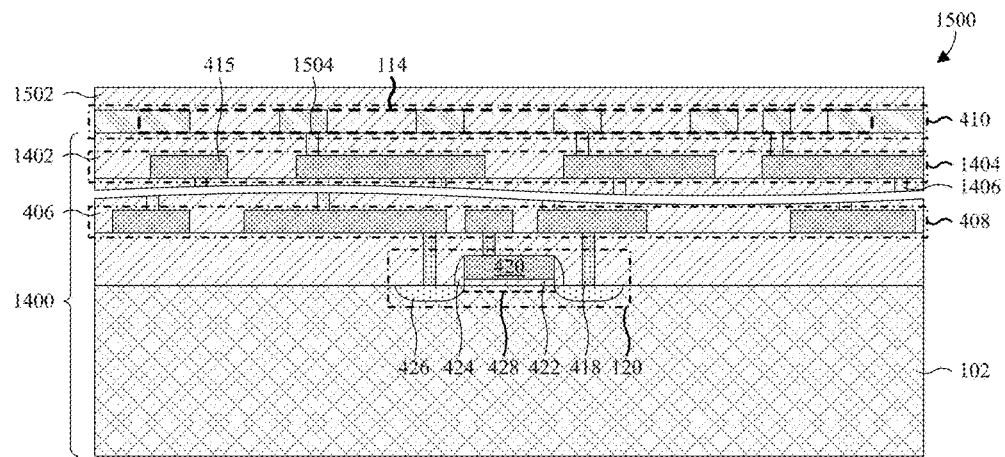

As illustrated by FIG. 15, a ground mesh 114 is formed over a semiconductor structure 1400 according to, for example, FIG. 14A or 14B, and formed electrically coupled to an underlying capacitor 120 of the semiconductor structure 1400. For example, as illustrated, the ground mesh 114 may be formed over the semiconductor structure 1400A of FIG. 14A and electrically coupled to a terminal of the FEOL capacitor 120c of FIG. 14A. In some embodiments, the ground mesh 114 is formed according to the mesh structure of FIG. 10. Further, after forming the ground mesh 114, the ground mesh 114 is covered by a ground ILD layer 1502.

In some embodiments, the process for forming and covering the ground mesh 114 comprises forming ground inter-metal vias 1504 on an upper side of the semiconductor structure 1400. Subsequently, a conductive layer is deposited over the semiconductor structure 1400 and the ground inter-metal vias 1504, and a selective etch is performed into the conductive layer to form a ground metal layer 410 comprising the ground mesh 114. Further, the ground ILD layer 1502 is deposited or otherwise formed over the ground mesh 114, and subsequently planarized by, for example, a CMP. In such embodiments, the ground mesh 114 is electrically coupled to the capacitor 120 through underlying inter-metal and/or contact vias 418, 1406, 1504 and metal layers 408, 1404.

Figure 16:
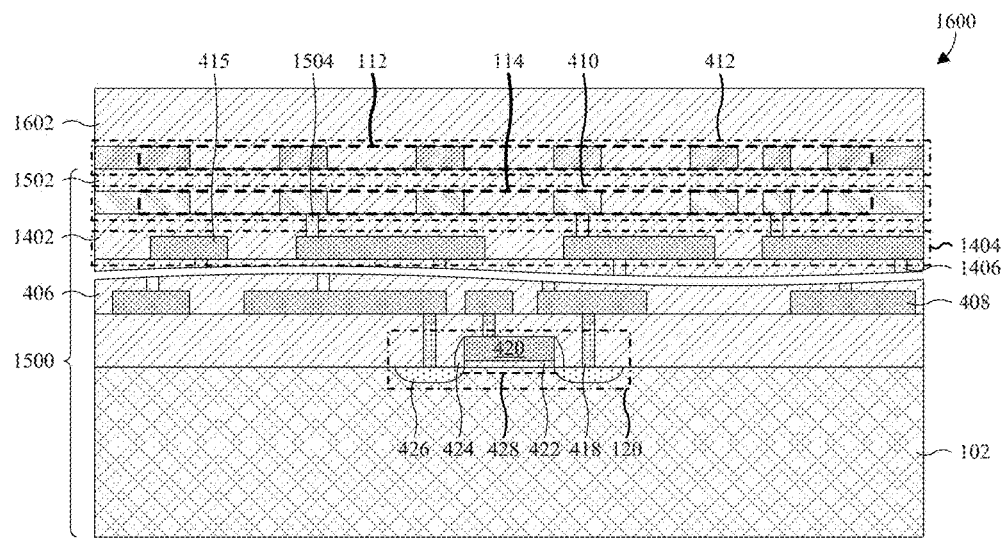

As illustrated by FIG. 16, a power mesh 112 is formed over a semiconductor structure 1500 according to, for example, FIG. 15 and subsequently covered by a power ILD layer 1602. In some embodiments, the power mesh 112 is formed according to the mesh structure of FIG. 10. Further, in some embodiments, the power mesh 112 shares a footprint with the ground mesh 114. The process for forming and covering the power mesh 112 may comprise, for example, depositing or otherwise forming a conductive layer over the semiconductor structure 1500 and performing a selective etch into the conductive layer to form a power metal layer 412 comprising the power mesh 112. The power ILD layer 1602 may then be deposited or otherwise formed over the power mesh 112, and subsequently planarized.

Figure 17:
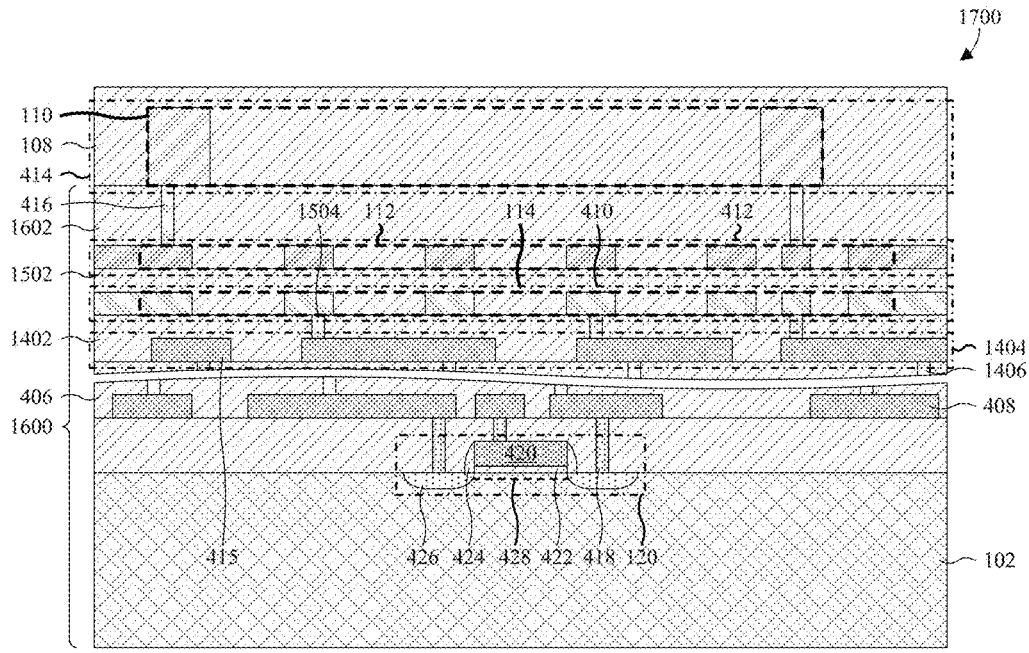

As illustrated by FIG. 17, an inductor 110 is formed over a semiconductor structure 1600 according to, for example, FIG. 16 and electrically coupled between an underlying capacitor 120 of the semiconductor structure 1600 and an underlying power mesh 112. For example, the inductor 110 may be electrically coupled between the capacitor 120 and the power mesh 112 through underlying inter-metal and/or contact vias 416, 418, 1406, 1504 and metal layers 408, 410, 412, 1404. In some embodiments, the inductor 110 is formed according one of the embodiments of FIG. 5, 7A-7H, or 8.

In some embodiments, the process for forming the inductor 110 comprises forming inter-metal vias 416 on an upper side of the semiconductor structure 1600. Subsequently, a conductive layer is deposited or otherwise formed over the semiconductor structure 1600 and the inter-metal vias 416, and a selective etch is performed into the conductive layer to form an inductor metal layer 414 comprising a layer of the inductor 110. The layer may, for example, comprise one or more inductor segments of the inductor 110. Further, an inductor ILD layer 108 is deposited or otherwise formed over the layer of the inductor 110, and subsequently planarized. The process may, for example, be repeated for each additional layer of the inductor 110.

Figure 18:
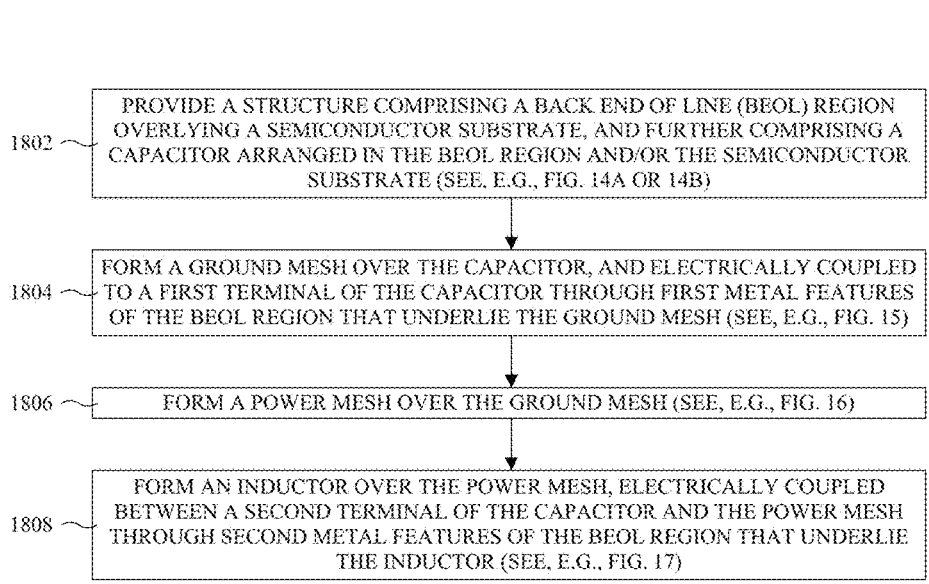
FIG. 18 illustrates a block diagram of some embodiments of a method for manufacturing an EBG structure.

With reference to FIG. 18, a block diagram 1800 of some embodiments of a method for manufacturing the EBG structure of FIG. 1 is provided.

At operation 1802, a semiconductor structure comprising a BEOL region overlying a semiconductor substrate, and further comprising a capacitor arranged in the BEOL region and/or the semiconductor substrate, is provided. See, for example, FIG. 14A or 14B. In some embodiments, the capacitor is a varactor with a deep well region.

At operation 1804, a ground mesh is formed over the capacitor, and electrically coupled to a first terminal of the capacitor through first metal features of the BEOL region that underlie the ground mesh. See, for example, FIG. 15.

At operation 1806, a power mesh is formed over the ground mesh. See, for example, FIG. 16. In some embodiments, the power mesh is formed with a same footprint as the ground mesh, and/or aligned by centroids or edges with the ground mesh.

At operation 1808, an inductor is formed over the power mesh, electrically coupled between a second terminal of the capacitor and the power mesh through second metal features of the BEOL region that underlie the inductor. See, for example, FIG. 17. In some embodiments, the length of the inductor spans multiple stacked layers, and/or the footprint of the inductor is ring shaped (e.g., square ring shaped).

While the disclosed method (e.g., the method described by the block diagram 1800) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

As can be appreciated from above, the present disclosure provides an IC die. A power mesh and a ground mesh are stacked within a BEOL region overlying a semiconductor substrate, and an inductor is arranged over the power and ground meshes. The inductor comprises a plurality of inductor segments stacked upon one another and connected end to end to define a length of the inductor. A capacitor underlies the power and ground meshes, and is connected in series with the inductor. Respective terminals of the capacitor and the inductor are respectively coupled to the power and ground meshes.

In other embodiments, the present disclosure provides a method for manufacturing an IC die. A semiconductor substrate is provided, and comprises a BEOL region overlying a semiconductor substrate and a capacitor. A ground mesh is formed over the capacitor and electrically coupled to a first terminal of the capacitor. A power mesh is formed over the ground mesh with a same footprint as the ground mesh and with a centroid aligned to a centroid of the ground mesh. An inductor is formed over the power mesh, and comprising a first terminal and a second terminal. The first terminal of the inductor is coupled to the power mesh, and the second terminal of the inductor is coupled to a second terminal of the capacitor.

In yet other embodiments, the present disclosure provides an IC die. A BEOL region overlies a semiconductor substrate, and a power mesh and a ground mesh are stacked within the BEOL region. Further, a series resonator comprises an inductor and a capacitor connected in series. Terminals of the series resonator are respectively coupled to the power and ground meshes. The inductor is arranged over the power mesh in the BEOL region and comprises a plurality of conductive layers stacked upon one another. The capacitor underlies the power and ground meshes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) die comprising:
a power mesh and a ground mesh stacked within a back end of line (BEOL) region overlying a semiconductor substrate, wherein a first opening in the power mesh overlaps and is substantially aligned with a second opening in the ground mesh;
an inductor arranged over the power and ground meshes, wherein the inductor comprises a plurality of inductor segments stacked upon one another and connected end to end to define a length of the inductor;
a capacitor underlying the power and ground meshes; and
a conductive column extending continuously through the first and second openings, wherein the conductive column is spaced from the ground and power meshes;
wherein the capacitor and the inductor are coupled in series, wherein a first terminal of the capacitor and a first terminal of the inductor are respectively coupled to the ground and power meshes, wherein a second terminal of the capacitor is electrically coupled to a second terminal of the inductor by the conductive column, and wherein the capacitor is electrically separated from the power mesh by the inductor.

2. The IC die according to claim 1, wherein a footprint of the inductor laterally surrounds a central opening with a substantially uniform thickness.

3. The IC die according to claim 1, wherein the inductor segments are spaced from one another by an interlayer dielectric (ILD) layer and are connected end to end by vias arranged between the inductor segments.

4. The IC die according to claim 1, wherein the inductor segments are arranged within a plurality of metal layers that are stacked within the BEOL region and connected by vias, and wherein one of the metal layers comprises an inner segment of the inductor segments and an outer segment of the inductor segments that laterally surrounds the inner segment.

5. The IC die according to claim 1, wherein the power mesh comprises an array of first openings and the ground mesh comprises an array of second openings, wherein the array of second openings has the same layout as the array of first openings and is vertically spaced from the array of first openings by a via layer of the BEOL region, and wherein edges of the power and ground meshes are aligned.

6. The IC die according to claim 1, wherein the capacitor comprises one or more of:
a metal-oxide-metal (MOM) capacitor;
a metal-insulator-metal (MIM) capacitor;
a metal-oxide-semiconductor (MOS) capacitor;
a MOS varactor; or
a diode-based capacitor.

7. The IC die according to claim 1, wherein the capacitor is arranged in the BEOL region, spaced from the semiconductor substrate underlying the BEOL region.

8. The IC die according to claim 1, wherein the capacitor comprises:
   a first well region and a second well region arranged in the semiconductor substrate that underlies the BEOL region, wherein the first well region overlies the second well region, and wherein the second well region is fully buried in the semiconductor substrate and comprises a higher doping concentration than the first well region.

9. The IC die according to claim 8, wherein the capacitor is arranged in a doped region of the semiconductor substrate that has a first doping type, wherein the first well region and the second well region share a second doping type that is opposite the first doping type, and wherein the capacitor further comprises:
   a gate structure arranged over the first well region; and
   a pair of contact regions arranged in the first well region, and laterally spaced on opposing sides of the gate structure, wherein the contact regions have a higher concentration of the second doping type than the first well region.

10. The IC die according to claim 1, wherein the inductor comprises:
    a first conductive layer defined by a first outer ring-shaped segment and a first inner ring-shaped segment;
    a second conductive layer defined by an L-shaped segment, a second outer ring-shaped segment, and a second inner ring-shaped segment;
    a third conductive layer defined by a third outer ring-shaped segment;
    a first via electrically coupling a first end of the L-shaped segment to a first end of the third outer ring-shaped segment;
    a second via electrically coupling a second end of the third outer ring-shaped segment to a first end of the second inner ring-shaped segment;
    a third via electrically coupling a second end of the second inner ring-shaped segment to a first end of the first inner ring-shaped segment;
    a fourth via electrically coupling the second end of the first inner ring-shaped segment to a first end of the second outer ring-shaped segment; and
    a fifth via electrically coupling a second end of the second outer ring-shaped segment to a first end of the first outer ring-shaped segment.

11. The IC die according to claim 1, wherein the BEOL region comprises a first metal layer and a second metal layer spaced under the first metal layer, wherein the inductor is arranged in the first and second metal layers, wherein the inductor segments are connected end to end, such that the length of the inductor is a sum of individual lengths of the inductor segments, and wherein the inductor steps down from the first metal layer to the second metal layer, and subsequently steps up from the second metal layer to the first metal layer, while extending along its length.

12. An integrated circuit (IC) die comprising:
    a back end of line (BEOL) region overlying a semiconductor substrate, wherein the semiconductor substrate comprises a first well region and a second well region, wherein the first well region overlies the second well region, wherein the second well region is fully buried in the semiconductor substrate, and wherein the first and second well regions have the same doping type and different doping concentrations;
    a power mesh and a ground mesh stacked within the BEOL region; and
    a series resonator comprising an inductor and a capacitor coupled in series, wherein terminals of the series resonator are respectively coupled to the power and ground meshes, wherein the inductor is arranged over the power mesh in the BEOL region and comprises a plurality of conductive layers stacked upon one another, wherein the capacitor is recessed into the first well region and underlies the power and ground meshes, and wherein the capacitor comprises a gate electrode;
    wherein the inductor comprises a plurality of inductor segments connected end to end, such that a length of the inductor is a sum of individual lengths of the inductor segments, wherein the BEOL region comprises a first metal layer and a second metal layer spaced under the first metal layer, wherein the inductor is arranged in the first and second metal layers, wherein the inductor steps down from the first metal layer to the second metal layer while extending along its length, and wherein the inductor steps up from the second metal layer to the first metal layer while extending along its length and after stepping down from the first metal layer to the second metal layer.

13. The IC die according to claim 12, wherein the inductor segments are stacked upon one another and spaced from one another, and wherein the inductor segments are coupled end to end to define the length of the inductor between terminals of the inductor.

14. The IC die according to claim 12, wherein the BEOL region comprises a plurality of interlayer dielectric (ILD) layers, a plurality of via layers, and a plurality of metal layers, wherein the ILD layers are stacked upon one another, wherein the metal layers include the conductive layers, wherein the metal layers and the via layers are alternatingly stacked within the ILD layers, and wherein the power and ground meshes and the inductor are defined by the metal layers.

15. The IC die according to claim 14, wherein the inductor is defined by a top one of the metal layers, and wherein the top one of the metal layers is thicker than underlying ones of the metal layers.

16. The IC die according to claim 12, wherein a first end of the inductor is electrically coupled to the power mesh, wherein a second end of the inductor is electrically coupled to a first terminal of the capacitor, and wherein a second terminal of the capacitor is electrically coupled to the ground mesh.

17. The IC die according to claim 16, wherein the gate electrode is arranged directly over the first and second well regions of the semiconductor substrate, wherein the first and second well regions have a first doping type and are arranged over and laterally surrounded by a doped region of the semiconductor substrate that has a second doping type opposite the first doping type.

18. An integrated circuit (IC) die comprising:
    a semiconductor substrate;
    a back end of line (BEOL) interconnect structure overlying the semiconductor substrate, wherein the BEOL interconnect structure comprises an interlayer dielectric (ILD) region, via layers, and metal layers, wherein the metal layers and the via layers are alternatingly stacked within the ILD region;
    an electronic device arranged over the semiconductor substrate, between the semiconductor substrate and the BEOL interconnect structure, wherein the electronic device is electrically coupled to the BEOL interconnect structure;

a power mesh defined within a first metal layer of the metal layers;

a ground mesh defined within a second metal layer of the metal layers, wherein the first and second metal layers neighbor;

an inductor arranged over the power and ground meshes, wherein the inductor is defined by a plurality of the metal layers spaced over the first and second metal layers, wherein the plurality of the metal layers includes a top metal layer of the metal layers, a third metal layer of the metal layers, and a fourth metal layer of the metal layers, wherein the third metal layer is spaced between the top metal layer and the fourth metal layer, wherein a first terminal of the inductor is electrically coupled to the power mesh by a via of the via layers, and wherein the inductor comprises a segment in the third metal layer that defines a second terminal of the inductor; and a capacitor arranged over the semiconductor substrate between the ground mesh and the semiconductor substrate, wherein a first terminal of the capacitor and a second terminal of the capacitor are electrically coupled respectively to the second terminal of the inductor and the ground mesh by the BEOL interconnect structure.

19. The IC die according to claim 18, wherein the capacitor is spaced over the semiconductor substrate, and is spaced between a fifth metal layer of the metal layers and a sixth metal layer of the metal layers that neighbors the fifth metal layer.

20. The IC die according to claim 18, wherein a via layer of the BEOL interconnect structure extends from an interface with the first metal layer to an interface with the second metal layer, wherein the IC die further comprises a conductive column extending continuously from a location spaced below the power and ground meshes, through the power and ground meshes, to a location spaced over the power and ground meshes, and wherein the conductive column is laterally spaced from the power and ground meshes while extending through the power and ground meshes.

* * * * *